United States Patent
Murai et al.

(10) Patent No.: US 10,319,883 B2
(45) Date of Patent: Jun. 11, 2019

(54) SEMICONDUCTOR DEVICE AND DISPLAY UNIT

(71) Applicant: JOLED INC., Tokyo (JP)

(72) Inventors: Atsuhito Murai, Tokyo (JP); Motohiro Toyota, Tokyo (JP)

(73) Assignee: JOLED INC., Tokyo (JP)

( * ) Notice: Subject to any disclaimer, the term of this patent is extended or adjusted under 35 U.S.C. 154(b) by 1 day.

(21) Appl. No.: 15/808,931

(22) Filed: Nov. 10, 2017

(65) Prior Publication Data

US 2018/0175246 A1   Jun. 21, 2018

(30) Foreign Application Priority Data

Dec. 20, 2016 (JP) ................... 2016-246393

(51) Int. Cl.
| | | |
|---|---|---|
| H01L 33/38 | (2010.01) | |
| H01L 33/40 | (2010.01) | |
| H01L 27/32 | (2006.01) | |
| H01L 27/12 | (2006.01) | |
| H01L 27/15 | (2006.01) | |

(52) U.S. Cl.
CPC .......... *H01L 33/38* (2013.01); *H01L 27/1214* (2013.01); *H01L 27/156* (2013.01); *H01L 27/3244* (2013.01); *H01L 27/3248* (2013.01); *H01L 33/40* (2013.01)

(58) Field of Classification Search
CPC ..... H01L 27/3265; H01L 33/38; H01L 33/40; H01L 27/3248; H01L 27/1214
See application file for complete search history.

(56) References Cited

U.S. PATENT DOCUMENTS

| | | | |
|---|---|---|---|
| 2012/0001167 A1 | 1/2012 | Morosawa | |
| 2012/0061671 A1* | 3/2012 | Hatano | .......... H01L 27/1225 257/57 |
| 2014/0291636 A1* | 10/2014 | Kim | .......... H01L 27/3262 257/40 |

FOREIGN PATENT DOCUMENTS

| | | |
|---|---|---|
| JP | 2012-15436 A | 1/2012 |
| JP | 2015-56565 A | 3/2015 |

* cited by examiner

*Primary Examiner* — Thanhha S Pham
(74) *Attorney, Agent, or Firm* — Hauptman Ham, LLP

(57) ABSTRACT

A semiconductor device includes a substrate, a gate electrode, an oxide semiconductor film, a first electrode, a second electrode, and a third electrode. The gate electrode is provided on the substrate. The oxide semiconductor film is provided on the substrate with the gate electrode interposed therebetween. The oxide semiconductor film includes a channel region facing the gate electrode and a low-resistance region adjacent to the channel region. The first electrode contains a constituent material same as that of the gate electrode, and has same thickness as that of the gate electrode. The second electrode has at least a portion facing the first electrode, and contains a constituent material same as that of the oxide semiconductor film. The third electrode has at least a portion provided at a position facing the first electrode with the second electrode interposed therebetween. The third electrode is electrically coupled to the first electrode.

19 Claims, 20 Drawing Sheets

SEMICONDUCTOR DEVICE AND DISPLAY UNIT

CROSS REFERENCE TO RELATED APPLICATIONS

This application claims the benefit of Japanese Priority Patent Application JP 2016-246393 filed on Dec. 20, 2016, the entire contents of which are incorporated herein by reference.

BACKGROUND

The technology relates to a semiconductor device including a thin film transistor (TFT), and to a display unit using the semiconductor device.

The semiconductor device including the TFT is used, for example, as a drive circuit of a unit such as a display unit. Such a semiconductor device is disclosed, for example, in Japanese Unexamined Patent Application Publications No. 2012-15436 and No. 2015-56565.

SUMMARY

It is desirable for such a semiconductor device to have lower parasitic capacitance.

It is desirable to provide a semiconductor device and a display unit that make it possible to lower parasitic capacitance.

A semiconductor device according to an embodiment of the technology includes a substrate, a gate electrode, an oxide semiconductor film, a first electrode, a second electrode, and a third electrode. The gate electrode is provided on the substrate. The oxide semiconductor film is provided on the substrate with the gate electrode interposed therebetween. The oxide semiconductor film includes a channel region facing the gate electrode and a low-resistance region adjacent to the channel region. The first electrode contains a constituent material same as that of the gate electrode, and has same thickness as that of the gate electrode. The second electrode has at least a portion that faces the first electrode, and contains a constituent material same as that of the oxide semiconductor film. The third electrode has at least a portion provided at a position facing the first electrode with the second electrode interposed therebetween. The third electrode is electrically coupled to the first electrode.

A display unit according to an embodiment of the technology includes a semiconductor device and a display element layer. The display element layer is provided on the semiconductor device, and includes a plurality of pixels. The semiconductor device includes a substrate, a gate electrode, an oxide semiconductor film, a first electrode, a second electrode, and a third electrode. The gate electrode is provided on the substrate. The oxide semiconductor film is provided on the substrate with the gate electrode interposed therebetween. The oxide semiconductor film includes a channel region facing the gate electrode and a low-resistance region adjacent to the channel region. The first electrode contains a constituent material same as that of the gate electrode, and has same thickness as that of the gate electrode. The second electrode has at least a portion that faces the first electrode, and contains a constituent material same as that of the oxide semiconductor film. The third electrode has at least a portion provided at a position facing the first electrode with the second electrode interposed therebetween. The third electrode is electrically coupled to the first electrode.

BRIEF DESCRIPTION OF THE DRAWINGS

The accompanying drawings are included to provide a further understanding of the disclosure, and are incorporated in and constitute a part of this specification. The drawings illustrate example embodiments and, together with the specification, serve to explain the principles of the technology.

DETAILED DESCRIPTION

Some example embodiments of the technology are described below in detail with reference to the accompanying drawings. It is to be noted that the description is given in the following order.

1. Example Embodiment (A display unit including a bottom-gate transistor of a self-aligned structure and a holding capacitor of a stacked structure)
2. Modification Example (An example in which a second electrode of a holding capacitor and an oxide semiconductor film of a driving transistor are integrated)
3. Functional Configuration Example of Display Unit
4. Example of Imaging Unit
5. Example of Electronic Apparatus

[Example Embodiment]
[Configuration]

Figure 1:
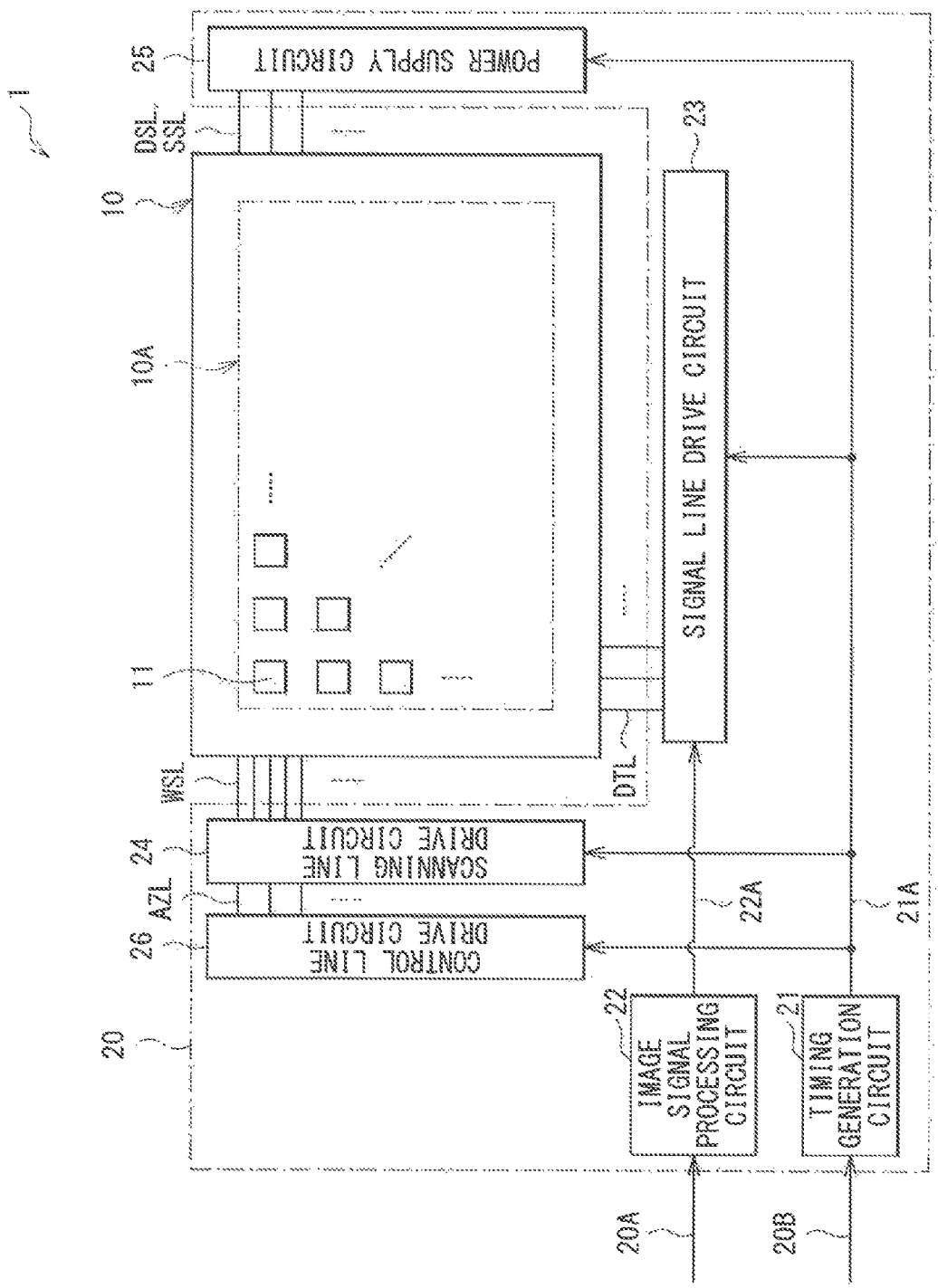
FIG. 1 is a schematic configuration diagram of a display unit according to an embodiment of the technology.

FIG. 1 illustrates a schematic configuration of a display unit 1 according to an embodiment of the technology. The display unit 1 may include a display panel 10 and a drive circuit 20. The drive circuit 20 may drive the display panel 10 on the basis of an image signal 20A and a synchronization signal 20B each inputted from the outside. The drive circuit 20 may include, for example, a timing generation circuit 21, an image signal processing circuit 22, a signal line drive circuit 23, a scanning line drive circuit 24, a power supply circuit 25, and a control line drive circuit 26.

[Display Panel 10]

In the display panel 10, a plurality of pixels 11 may be arranged in matrix throughout an entire surface of a display region 10A of the display panel 10. Active matrix driving of each of the pixels 11 by the drive circuit 20 may cause the display panel 10 to display an image on the basis of the image signal 20A inputted from the outside.

Figure 2:
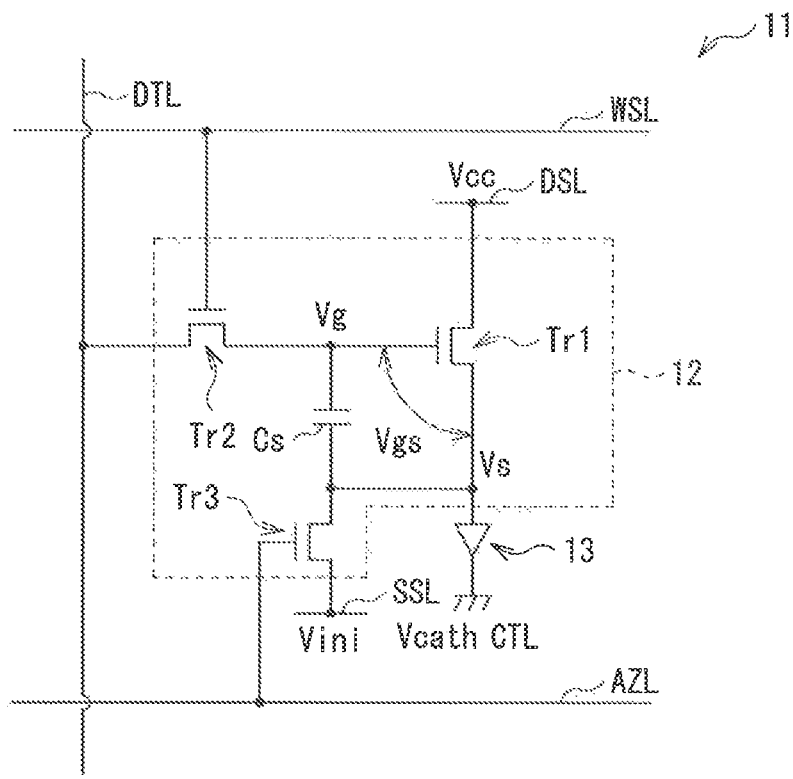
FIG. 2 illustrates an example of a circuit configuration of each of pixels illustrated in FIG. 1.

FIG. 2 illustrates an example of a circuit configuration of each of the pixels 11. Each of the pixels 11 may include, for example, a pixel circuit 12 and an organic electroluminescence (EL) element 13. The organic EL element 13 may have a configuration in which, for example, an anode electrode, i.e., an anode electrode 41 illustrated in each of FIGS. 5A and 5B described later, an organic layer, and a cathode electrode are stacked in order. The organic EL element 13 may have element capacitance. The pixel circuit 12 may control light emission and light extinction of the organic EL element 13. The pixel circuit 12 may be configured by, for example, a driving transistor Tr1, a switching transistor Tr2, a cut-off transistor Tr3, and a holding capacitor Cs, and may have a circuit configuration of 3Tr1C.

The switching transistor Tr2 may control application of a signal voltage corresponding to the image signal 20A, to a gate of the driving transistor Tr1. More specifically, the switching transistor Tr2 may sample a voltage of a signal line DTL described later and write the sampled voltage into the gate of the driving transistor Tr1. The driving transistor Tr1 may drive the organic EL element 13, and may be coupled in series to the organic EL element 13. The driving transistor Tr1 may control a current that flows through the organic EL element 13 on the basis of magnitude of the voltage sampled by the switching transistor Tr2. The cut-off transistor Tr3 may be configured, for example, to reset a source (anode potential) of the driving transistor Tr1. The holding capacitor Cs may hold a predetermined voltage between the gate and the source of the driving transistor Tr1. It is to be noted that the pixel circuit 12 either may have a circuit configuration that includes various capacitors and various transistors in addition to the above-described 3Tr1C circuit, or may have any other circuit configuration such as 2Tr1C.

The driving transistor Tr1, the switching transistor Tr2, and the cut-off transistor Tr3 may be each configured by, for example, an n-channel metal oxide semiconductor (MOS) thin film transistor. Detailed configuration of each of the driving transistor Tr1, the switching transistor Tr2, and the cut-off transistor Tr3 is described later.

The display panel 10 may include a plurality of scanning lines WSL each extending in a row direction, a plurality of signal lines DTL each extending in a column direction, a plurality of power supply lines DSL each extending in a row direction, and a plurality of power supply lines SSL each extending in a row direction. The display panel 10 may further include a plurality of control lines AZL each extending in a row direction, and a plurality of cathode lines CTL each extending in a row direction. It is to be noted that the cathode lines CTL may be each configured by a common single sheet-shaped metal layer. The scanning lines WSL may be each used to select corresponding one of the pixels 11. The scanning lines WSL may each supply the corresponding one of the pixels 11 with a selection pulse to thereby select the corresponding one of the pixels 11 for each row. The signal lines DTL may be each used to supply corresponding one of the pixels 11 with a signal voltage Vsig based on the image signal and a fixed voltage Vofs. The power supply lines DSL may each supply corresponding one of the pixels 11 with electricity, and may each supply the corresponding one of the pixels 11 with a fixed voltage Vcc. The power supply lines SSL may be each used for preparation of Vth correction, and may supply corresponding one of the pixels 11 with a fixed voltage Vini. The control lines AZL may be each used for the preparation of the Vth correction, and may supply corresponding one of the pixels 11 with a control pulse that performs on/off control of the cut-off transistor Tr3. The cathode lines CTL may define a cathode voltage of the organic EL element 13, and may supply corresponding one of the pixels 11 with a cathode voltage Vcath.

The pixel 11 may be provided in the vicinity of an intersection of each of the signal lines DTL and each of the scanning lines WSL. Each of the signal lines DTL may be coupled to an unillustrated output end of the signal line drive circuit 23 described later and to a source or a drain of the switching transistor Tr2. Each of the scanning lines WSL may be coupled to an unillustrated output end of the scanning line drive circuit 24 described later and to a gate of the switching transistor Tr2. Each of the power supply lines DSL may be coupled to an unillustrated output end of a power source that outputs a fixed voltage and to the source or a drain of the driving transistor Tr1. The cathode line CTL may be a member provided around the display region 10A, and may be coupled to a member having a reference voltage.

The gate of the switching transistor Tr2 may be coupled to corresponding one of the scanning lines WSL. One of the source and the drain of the switching transistor Tr2 may be coupled to corresponding one of the signal lines DTL. A terminal of the source and the drain of the switching transistor Tr2, which is not coupled to any of the signal lines DTL, may be coupled to the gate of the driving transistor Tr1. One of the source and the drain of the driving transistor Tr1 may be coupled to corresponding one of the power supply lines DSL.

A terminal of the source and the drain of the driving transistor Tr1, which is not coupled to any of the power supply lines DSL, may be coupled to the anode of the organic EL element 13. One end of the holding capacitor Cs may be coupled to the gate of the driving transistor Tr1. The other end of the holding capacitor Cs may be coupled to the source of the driving transistor Tr1, i.e., the terminal on side of the organic EL element 13 in FIG. 2. In other words, the holding capacitor Cs may be inserted between the gate and the source of the driving transistor Tr1. A gate of the cut-off transistor Tr3 may be coupled to corresponding one of the control lines AZL. One of a source and a drain of the cut-off transistor Tr3 may be coupled to the source terminal of the driving transistor Tr1. A terminal of the source and the drain of the cut-off transistor Tr3, which is not coupled to the source terminal of the driving transistor Tr1, may be coupled to corresponding one of the power supply lines SSL (reset potential).

[Drive Circuit 20]

Description is given next of the drive circuit 20. As described above, the drive circuit 20 may include, for example, the timing generation circuit 21, the image signal processing circuit 22, the signal line drive circuit 23, the scanning line drive circuit 24, the power supply circuit 25, and the control line drive circuit 26. The timing generation circuit 21 may perform a control to allow the respective circuits inside the drive circuit 20 to operate in cooperation with one another. The timing generation circuit 21 may output a control signal 21A to the above-described respective circuits in response to (i.e., in synchronization with), for example, the synchronization signal 20B inputted from the outside.

The image signal processing circuit 22 may perform a predetermined correction of the digital image signal 20A inputted from the outside, for example, and may output, to the signal line drive circuit 23, an image signal 22A obtained from the predetermined correction. Examples of the predetermined correction may include gamma correction and overdrive correction.

The signal line drive circuit 23 may apply, to each of the signal lines DTL, the analog signal voltage Vsig corresponding to the image signal 22A inputted from the image signal processing circuit 22, in response to (i.e., in synchronization with) an input of the control signal 21A, for example. The signal line drive circuit 23 may be able to output two types of voltages (i.e., Vofs and Vsig), for example. More specifically, the signal line drive circuit 23 may supply the pixel 11 selected by the scanning line drive circuit 24 with the two types of voltages (i.e., Vofs and Vsig) through corresponding one of the signal lines DTL. The signal voltage Vsig may be a voltage value corresponding to the image signal 20A. The fixed voltage Vofs may be a fixed voltage irrespective of the image signal 20A. The minimum voltage of the signal voltage Vsig may be a voltage value lower than that of the fixed voltage Vofs, and the maximum voltage of the signal voltage Vsig may be a voltage value higher than that of the fixed voltage Vofs.

The scanning line drive circuit 24 may sequentially output, to each of the scanning lines WSL, a selection pulse at a predetermined unit. The scanning line drive circuit 24 may select the plurality of scanning lines WSL in a predetermined sequence, in response to (i.e., in synchronization with) the input of the control signal 21A, for example. The line drive circuit 24 may thereby perform initialization, the Vth correction, writing of the signal voltage Vsig, μ correction, and light emission in a predetermined order.

The initialization refers to initializing a gate voltage of the driving transistor Tr1 (e.g., to have Vofs). The Vth correction refers to a correction operation to bring a gate-source voltage Vgs of the driving transistor Tr1 closer to a threshold voltage Vth of the driving transistor Tr1. The writing of the signal voltage Vsig (i.e., signal writing) refers to an operation to write the signal voltage Vsig into the gate of the driving transistor Tr1 through the switching transistor Tr2. The μ correction refers to an operation to correct a voltage held between the gate and the source of the driving transistor Tr1 (i.e., the gate-source voltage Vgs) on the basis of magnitude of mobility μ of the driving transistor Tr1. There may be a case where the signal writing and the μ correction are performed at different timings.

The power supply circuit 25 may output a constant voltage to each of the power supply lines DSL. The power supply circuit 25 may continue outputting the constant voltage, i.e., the fixed voltage Vcc to each of the power supply lines DSL in one frame period, and may continue outputting the constant voltage, i.e., the fixed voltage Vini to each of the power supply lines SSL. Here, each of the fixed voltages Vcc and Vini is a constant voltage irrespective of the image signal 20A. The fixed voltage Vcc is a voltage value equal to or more than a summed voltage of a threshold voltage Vel of the organic EL element 13 and the cathode voltage Vcath of the organic EL element 13 (i.e., Vel+Vcath). The fixed voltage Vini is a voltage value equal to or lower than a subtraction of Vth from Vofs (Vofs−Vth).

The control line drive circuit 26 may sequentially output a control pulse for each of control terminals AZ (AZ1 to AZk) for the preparation of the Vth correction. The control line drive circuit 26 may sequentially select the plurality of control terminals AZ in response to (i.e., in synchronization with) the input of the control signal 21A, for example, to thereby perform the preparation of the Vth correction. Respective output terminals of the control line drive circuit 26 may be coupled to different control terminals AZ. As used herein, the "preparation of Vth correction" refers to setting a source voltage Vs of the driving transistor Tr1, at the start of the Vth correction, to a voltage value (i.e., fixed voltage Vini) that enables the Vth correction to be started.

Figure 3:
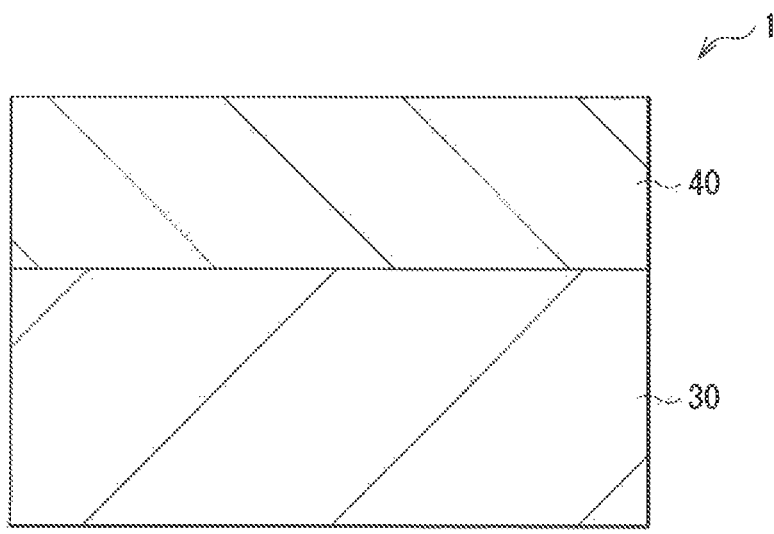
FIG. 3 is a cross-sectional view of a schematic configuration of the display unit illustrated in FIG. 1.

FIG. 3 schematically illustrates a cross-sectional configuration of the display unit 1. The display panel 10 may include, for example, a semiconductor device 30 and a display element layer 40 that includes the above-described organic EL element 13. The semiconductor device 30 may include the pixel circuit 12, for example. More specifically, the semiconductor device 30 may include, for example, the driving transistor Tr1, the switching transistor Tr2, the cut-off transistor Tr3, the holding capacitor Cs, the scanning line WSL, the signal line DTL, the power supply lines DSL and SSL, and the control line AZL.

Figure 4:
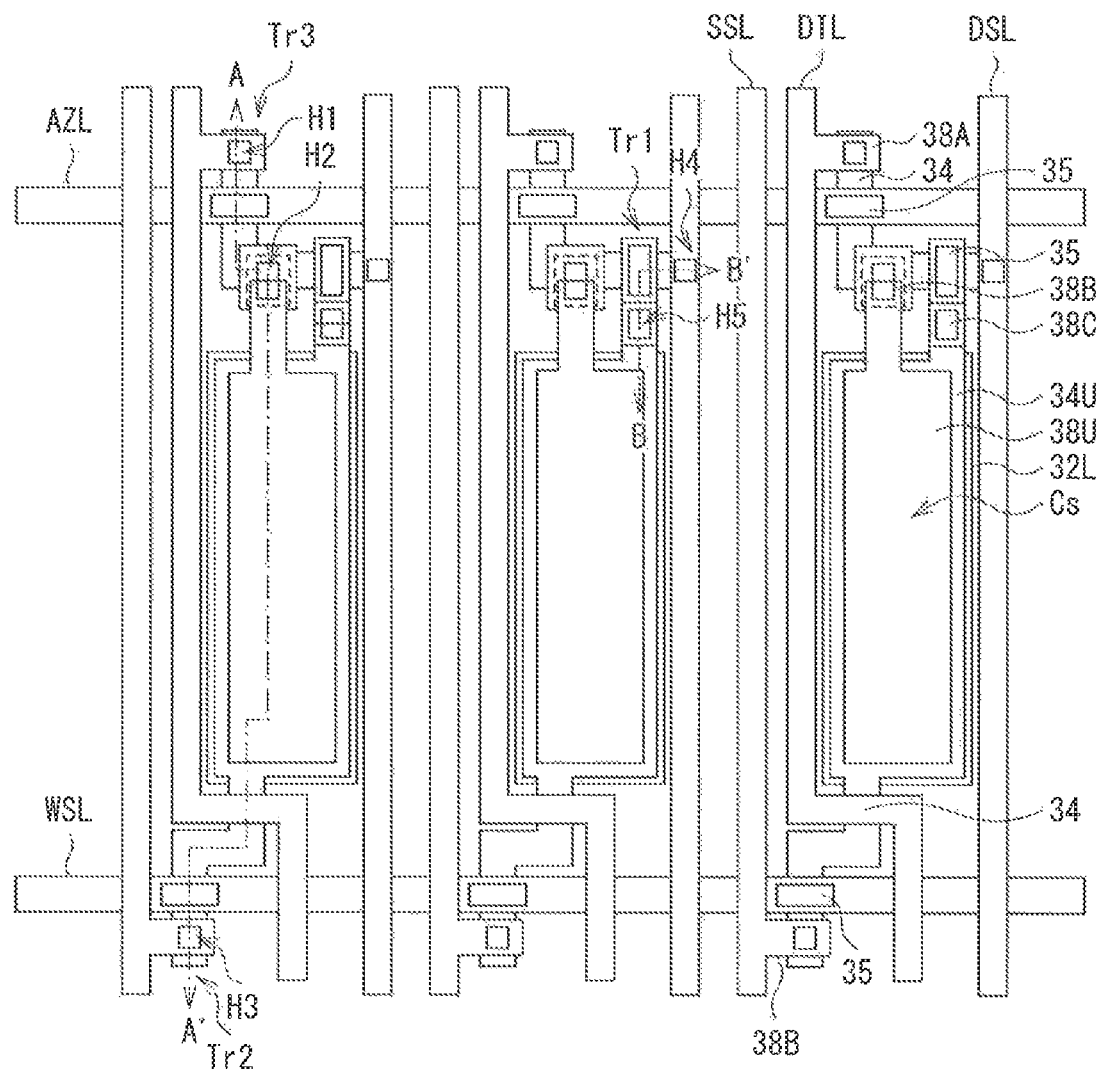
FIG. 4 is a plan view of a schematic configuration of a semiconductor device illustrated in FIG. 3.
Figure 5A:
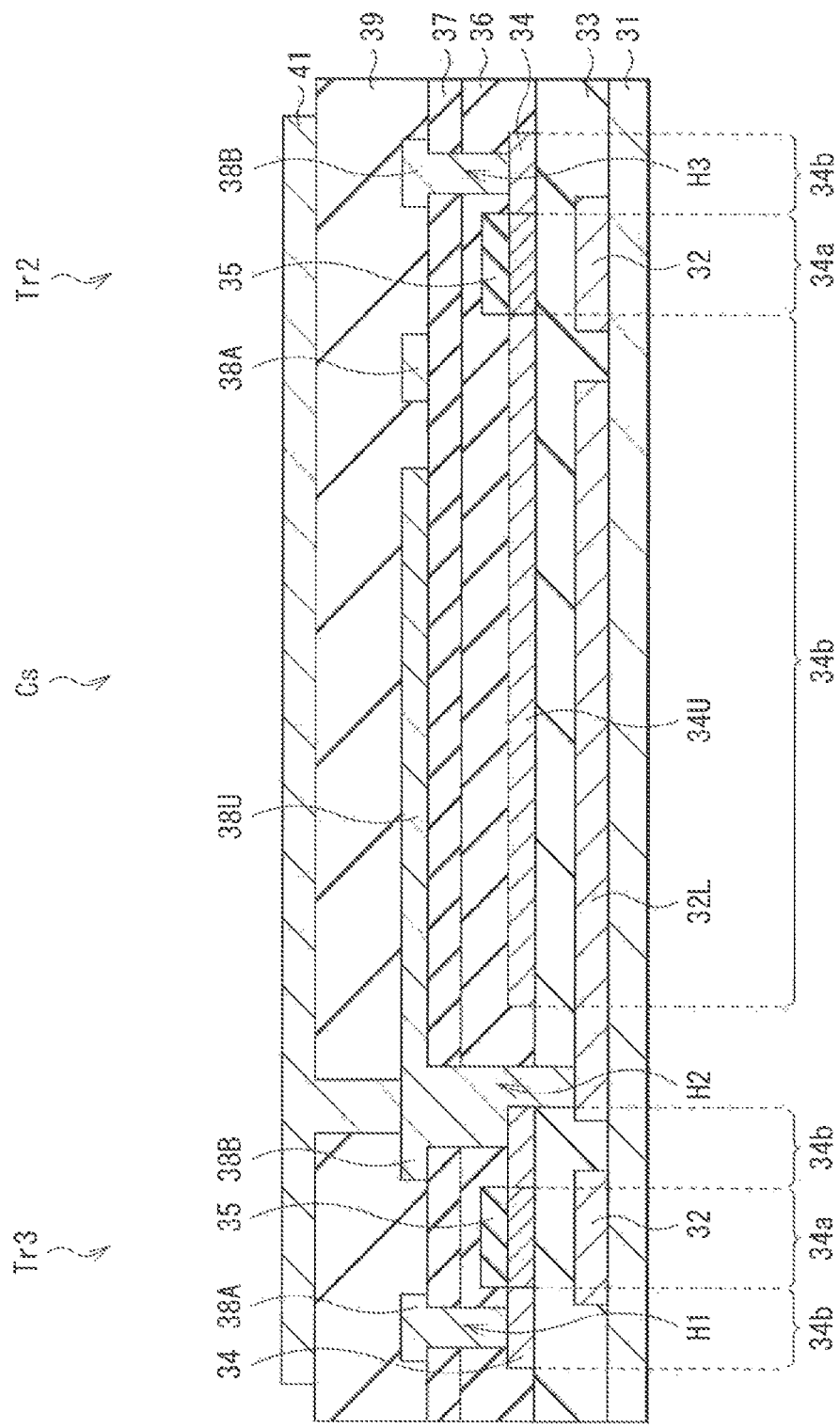
FIG. 5A illustrates a cross-sectional configuration of the semiconductor device illustrated in FIG. 4 taken along a line A-A'.
Figure 5B:
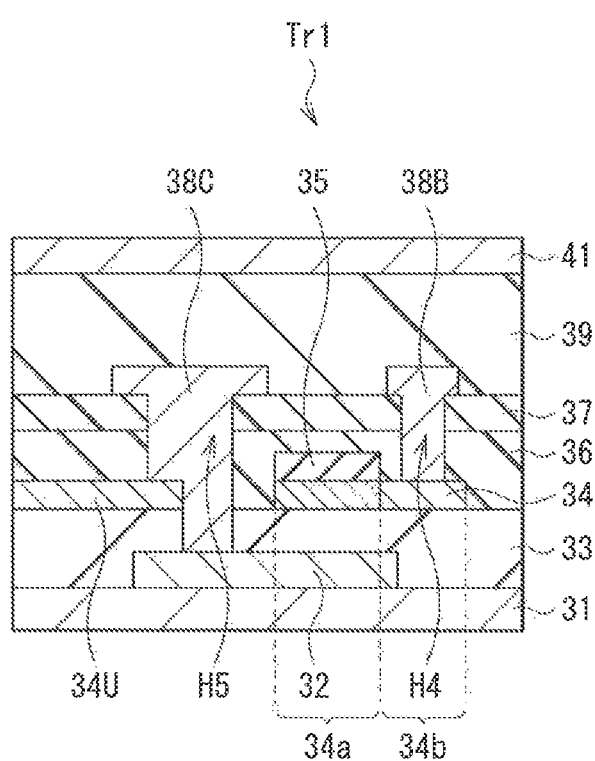
FIG. 5B illustrates a cross-sectional configuration of the semiconductor device illustrated in FIG. 4 taken along a line B-B'.

FIG. 4 illustrates a planar configuration of the semiconductor device 30. FIG. 5A illustrates a cross-sectional configuration of the semiconductor device 30 taken along a line A-A' illustrated in FIG. 4. FIG. 5B illustrates a cross-sectional configuration of the semiconductor device 30 taken along a line B-B' illustrated in FIG. 4. FIGS. 5A and 5B each illustrate the anode electrode 41 of the display element layer 40 together with the semiconductor device 30.

In the semiconductor device 30, the driving transistor Tr1, the switching transistor Tr2, the cut-off transistor Tr3, and the holding capacitor Cs may be disposed in different regions on a substrate 31. The driving transistor Tr1, the switching transistor Tr2, and the cut-off transistor Tr3 may be each a bottom-gate thin film transistor, and may have the same element structure, for example.

Figure 6:
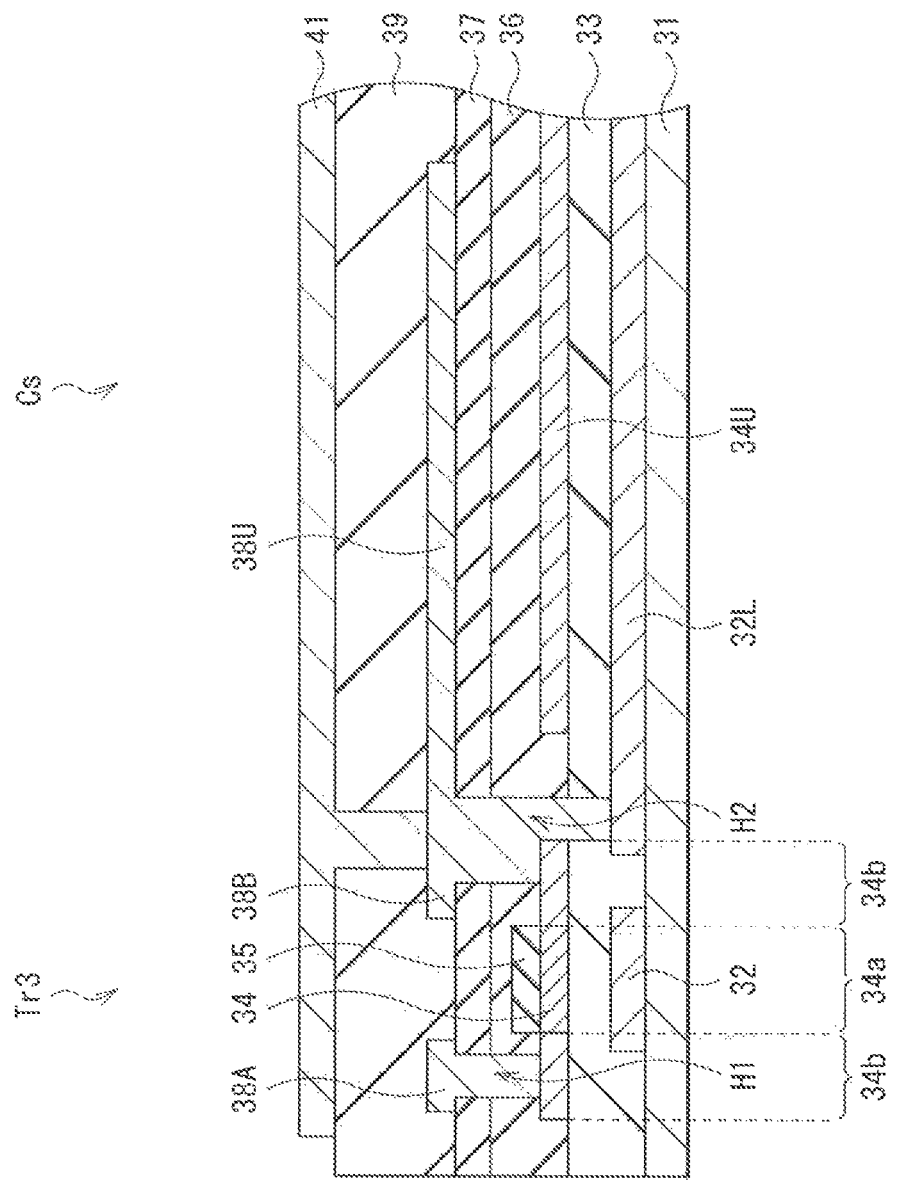
FIG. 6 is a cross-sectional view of a portion of FIG. 5A.

FIG. 6 illustrates a configuration of each of the cut-off transistor Tr3 and the holding capacitor Cs illustrated in FIG. 5A. FIG. 6 is used to describe the configuration of each of the cut-off transistor Tr3 (driving transistor Tr1 and switching transistor Tr2) and the holding capacitor Cs.

The cut-off transistor Tr3 may include, on the substrate 31, a gate electrode 32, a first insulating film 33, an oxide semiconductor film 34, a channel protective film 35, a second insulating film 36, a third insulating film 37, and source-drain electrodes 38A and 38B, in this order. The source-drain electrodes 38A and 38B may be electrically coupled to the oxide semiconductor film 34, i.e., a low-resistance region 34b described later through contact holes H1 and H2. The source-drain electrodes 38A and 38B may be each covered with an interlayer insulating film 39. The anode electrode 41, i.e., the display element layer 40 may be provided on the interlayer insulating film 39. The oxide semiconductor film 34 may include a channel region 34a that faces the gate electrode 32, and the low-resistance region 34b adjacent to the channel region 34a. The channel protective film 35 that covers the channel region 34a may be formed by exposure from rear surface side of the substrate 31 using a pattern of the gate electrode 32 as a mask. That is, the cut-off transistor Tr3 may have a so-called self-aligned structure. This enables parasitic capacitance to be smaller, although the detail is described later.

The driving transistor Tr1 and the switching transistor Tr2 may each also have an element structure similar to that of the above-described cut-off transistor Tr3. In other words, the semiconductor device 30 may include components such as a plurality of gate electrodes 32 and a plurality of oxide semiconductor films 34. A portion of the gate electrodes 32 and a portion of the oxide semiconductor films 34 configure the driving transistor Tr1; another portion of the gate electrodes 32 and another portion of the oxide semiconductor films 34 configure the switching transistor Tr2; and a remaining portion of the gate electrodes 32 and a remaining portion of the oxide semiconductor films 34 configure the cut-off transistor Tr3.

The holding capacitor Cs may include, on the substrate 31, a first electrode 32L, a second electrode 34U, and a third electrode 38U, in this order. The third electrode 38U may be electrically coupled to the first electrode 32L through the contact hole H2. The first electrode 32L, the second electrode 34U, and the third electrode 38U may have a mutually overlapping part in a plan view. In other words, the holding capacitor Cs may be a capacitive element of a stacked structure in which the second electrode 34U is interposed between the first electrode 32L and the third electrode 38U that are electrically coupled to each other. The first insulating film 33 may be provided between the first electrode 32L and the second electrode 34U. The second insulating film 36 and the third insulating film 37 may be provided between the second electrode 34U and the third electrode 38U. The third electrode 38U may be covered with the interlayer insulating film 39.

The source-drain electrode 38B of the switching transistor Tr2 may be electrically coupled to the low-resistance region 34b of the oxide semiconductor film 34 through a contact hole H3. The source-drain electrode 38B of the driving transistor Tr1 may be electrically coupled to the low-resistance region 34b of the oxide semiconductor film 34 through a contact hole H4. The gate electrode 32 of the driving transistor Tr1 may be electrically coupled to the second electrode 34U of the holding capacitor Cs through an electrically conductive film 38C. The electrically conductive film 38C may be provided in a contact hole H5 as illustrated in FIGS. 4 and 5B.

The substrate 31 may be made of glass, quartz, silicon, a resin material, or a metal plate, for example. Examples of the resin material may include polyethylene terephthalate (PET), polyimide (PI), polycarbonate (PC), and polyethylene naphthalate (PEN). The substrate 31 may have light-transmissivity.

[Cut-Off Transistor Tr3]

The gate electrode 32 may be provided in a selective region on the substrate 31. The gate electrode 32 may serve to control density of electrons in the channel region 34a of the oxide semiconductor film 34 by application of the gate voltage. The gate electrode 32 may contain metal such as molybdenum (Mo), tungsten (W), aluminum (Al), copper (Cu), silver (Ag), and titanium (Ti), for example. The gate electrode 32 may be made of an alloy, or alternatively may be configured by a stacked film containing a plurality of metal films. The gate electrode 32 may be configured by a stacked film in which, for example, titanium having a thickness of about 50 nm, aluminum having a thickness of about 300 nm, and titanium having a thickness of about 50 nm are stacked in this order from side of the substrate 31.

The first insulating film 33 provided between the gate electrode 32 and the oxide semiconductor film 34 may serve as a gate insulating film. The first insulating film 33 may cover, for example, the gate electrode 32 and the first electrode 32L, and may be provided throughout an entire surface of the substrate 31. The first insulating film 33 may cover a step difference caused by the gate electrode 32, and may serve to planarize the step difference. The first insulating film 33 may also serve to prevent a harmful substance from entering the oxide semiconductor film 34 from side of the substrate 31, thus making it possible to improve reliability of the cut-off transistor Tr3 (driving transistor Tr1 and switching transistor Tr2). The first insulating film 33 may be preferably configured by a stacked film of a silicon nitride ($SiN_x$) film located at a position close to the substrate 31 and a silicon oxide ($SiO_2$) film that covers the silicon nitride film. In this situation, for example, the silicon nitride film may have a thickness of 200 nm, and the silicon oxide film may have a thickness of 100 nm. A crack, for example, caused by the step difference of the gate electrode 32 is less likely to occur in the first insulating film 33 that contains the silicon nitride film, because of superior coverage (i.e., step-covering property) of the silicon nitride film. Further, the silicon nitride film contains hydrogen (H), and the hydrogen terminates a defect in the oxide semiconductor film 34.

The oxide semiconductor film 34 may be provided on the substrate 31 with the gate electrode 32 being interposed therebetween, and may be disposed in a selective region on the first insulating film 33. As a material of the oxide semiconductor film 34, a compound may be used that contains oxygen and an element such as indium (In), gallium (Ga), zinc (Zn), and tin (Sn), for example. The oxide semiconductor film 34 may be configured by an amorphous oxide semiconductor, or alternatively may be configured by a crystalline oxide semiconductor. Examples of the amorphous oxide semiconductor may include indium-gallium-zinc oxide (IGZO). Examples of the crystalline oxide semiconductor may include zinc oxide (ZnO), indium-zinc oxide (IZO), indium-gallium oxide (IGO), indium-tin oxide (ITO), and indium oxide (InO). The oxide semiconductor film 34 may have a thickness of about 30 nm, for example.

The low-resistance region 34b of the oxide semiconductor film 34 may be a region with a resistance lower than that of the channel region 34a. The low-resistance region 34b may be provided adjacently to and on both sides of the channel region 34a. For example, a part other than the channel region 34a of the oxide semiconductor film 34 may be the low-resistance region 34b.

The channel protective film 35 may be in contact with the oxide semiconductor film 34, and may be provided on the channel region 34a. The channel protective film 35 may serve to protect the channel region 34a upon formation of the low-resistance region 34b of the oxide semiconductor film 34. For example, the channel protective film 35 may be configured by a single film of such as a silicon oxide ($SiO_2$) film, a silicon nitride ($SiN_x$) film, and an aluminum oxide ($Al_2O_3$) film, or alternatively may be configured by a stacked film. The channel protective film 35 may have a thickness of about 150 nm, for example.

Figure 7:
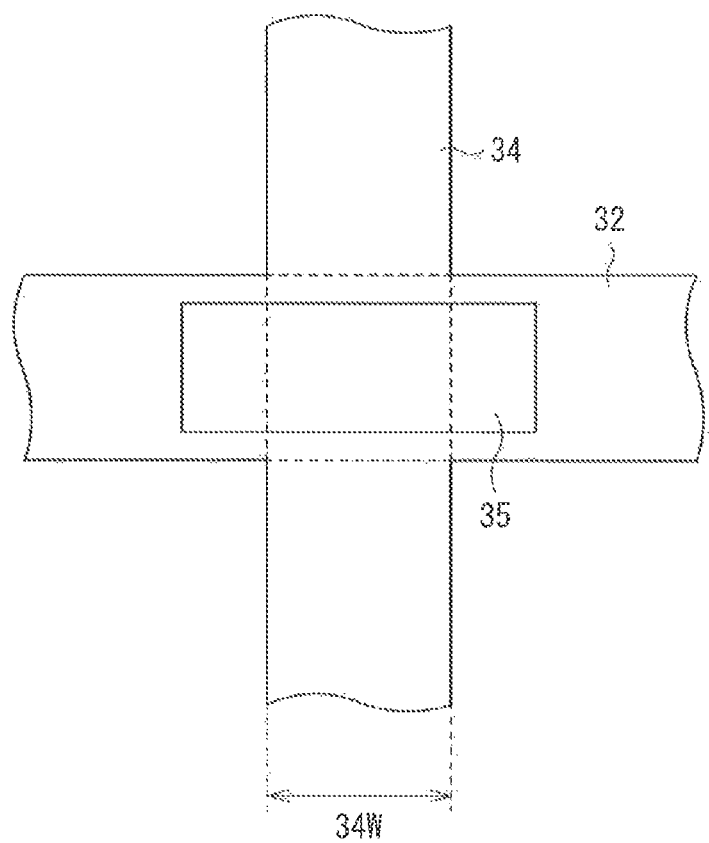
FIG. 7 is a plan view of a configuration of a channel protective film illustrated in FIG. 6.

FIG. 7 illustrates a planar configuration of the channel protective film 35. The channel protective film 35 may be provided in inner side of the gate electrode 32, and may be provided to have a width larger than a channel width 34W of the oxide semiconductor film 34, in a plan view.

The second insulating film 36 on the channel protective film 35 may be provided throughout the entire surface of the substrate 31, for example, to cover the oxide semiconductor film 34 together with the channel protective film 35. The second insulating film 36 may be in contact with the low-resistance region 34b of the oxide semiconductor film 34. In the present example embodiment, the second insulating film 36 may contain metal. Thus, in the low-resistance region 34b of the oxide semiconductor film 34 with which the second insulating film 36 is in contact, resistance fluctuation is suppressed, and a low-resistance state is stably maintained. Further, the second insulating film 36 has a high barrier property against hydrogen and moisture, for example, thus suppressing a change in carrier density in the channel region 34a of the oxide semiconductor film 34. Hence, it becomes possible to stabilize characteristics of the cut-off transistor Tr3 (driving transistor Tr1 and switching transistor Tr2).

Examples of the metal contained in the second insulating film 36 may include aluminum (Al), erbium (Er), and titanium (Ti). The second insulating film 36 may be, for example, an oxide film that contains such a metal, and may be made of aluminum oxide ($Al_2O_3$) having a thickness of about 20 nm, for example.

The third insulating film 37 may be stacked on the second insulating film 36. The second insulating film 36 and the third insulating film 37 may be provided between the oxide semiconductor film 34 and each of the pair of source-drain electrodes 38A and 38B. In other words, the source-drain electrodes 38A and 38B may be electrically coupled to the respective low-resistance regions 34b of the oxide semiconductor film 34, respectively, through the contact holes H1 and H2 each provided on the third insulating film 37 and the second insulating film 36. Likewise, the source-drain electrode 38B of the switching transistor Tr2 and the source-drain electrode 38B of the driving transistor Tr1 may also be electrically coupled to the respective low-resistance regions 34b of the oxide semiconductor film 34, respectively, through the contact holes H3 and H4 each provided on the third insulating film 37 and the second insulating film 36, as illustrated in FIGS. 5A and 5B.

The third insulating film 37 may be provided throughout the entire surface of the substrate 31, for example. A silicon oxide ($SiO_2$) film having a thickness of about 200 nm, for example, may be used as the third insulating film 37. The source-drain electrodes 38A and 38B may be preferably provided in a region other than the region immediately above the gate electrode 32, for example. This makes it possible to reduce the parasitic resistance generated at respective intersected regions of the gate electrode 32 and each of the source-drain electrodes 38A and 38B.

The source-drain electrodes 38A and 38B may each contain metal such as molybdenum (Mo), tungsten (W), aluminum (Al), copper (Cu), silver (Ag), and titanium (Ti), for example. The source-drain electrodes 38A and 38B may be each made of an alloy, or alternatively may be configured by a stacked film containing a plurality of metal films. The source-drain electrodes 38A and 38B may be configured by a stacked film in which, for example, titanium having a thickness of about 50 nm, aluminum having a thickness of about 300 nm, and titanium having a thickness of about 50 nm are stacked in this order, on the third insulating film 37.

The source-drain electrodes 38A and 38B may be each covered with the interlayer insulating film 39. The interlayer insulating film 39 may have a stacked structure in which, for example, an inorganic insulating film and an organic resin film are provided in this order, on each of the source-drain electrodes 38A and 38B. As the organic resin film, for example, an organic resin film having photosensitivity may be used. More specific examples of the organic resin film having photosensitivity may include novolak resin, polyimide resin, and acrylic resin. Examples of the inorganic insulating film may include a silicon oxide ($SiO_2$) film, a silicon nitride (SiN) film, and a silicon oxynitride (SiON) film. The interlayer insulating film 39 may be configured by one of the inorganic insulating film and the organic resin film. The anode electrode 41 may be provided on the interlayer insulating film 39. The anode electrode 41 may be electrically coupled to the source-drain electrode 38B of the cut-off transistor Tr3 through a contact hole provided in the interlayer insulating film 39. The contact hole may be provided, for example, at a position overlapping the contact hole H2 in a plan view.

[Holding Capacitor Cs]

The first electrode 32L may be provided in a selective region on the substrate 31. As described later, the first electrode 32L may be formed by the same steps as those of the gate electrode 32 of the cut-off transistor Tr3 (driving transistor Tr1 and switching transistor Tr2), for example. The first electrode 32L may be made of a constituent material the same as that of the gate electrode 32, and may have the same thickness as that of the gate electrode 32. As used herein, the phrase "have the same thickness" refers to formation by the same manufacturing steps, and tolerates a slight difference caused by a factor such as a manufacturing error. The same holds true also for description to be given hereinafter.

The second electrode 34U may face the first electrode 32L with the first insulating film 33 being interposed therebetween. At least a portion of the second electrode 34U may be provided at a position overlapping the first electrode 32L in a plan view. That is, an electric charge may be stored between the second electrode 34U and the first electrode 32L. As described later, the second electrode 34U may be formed by the same steps as those of the oxide semiconductor film 34 of the cut-off transistor Tr3 (driving transistor Tr1 and switching transistor Tr2), for example. In other words, the second electrode 34U may contain a constituent material the same as that of the oxide semiconductor film 34, and may have the same thickness as that of the low-resistance region 34b of the oxide semiconductor film 34.

The second electrode 34U may be made of an oxide semiconductor material that is caused to have a lower resistance, for example. The second electrode 34U may be electrically coupled to the oxide semiconductor film 34 of the switching transistor Tr2. For example, the second electrode 34U and the oxide semiconductor film 34 of the switching transistor Tr2 may be formed integrally, as illustrated in FIGS. 4 and 5A.

The third electrode 38U may face the second electrode 34U with the second insulating film 36 and the third insulating film 37 each being interposed therebetween. At least a portion of the third electrode 38U may be provided at a position overlapping the second electrode 34U in a plan view. That is, an electric charge may be stored between the third electrode 38U and the second electrode 34U. The third electrode 38U may also face the first electrode 32L with the second electrode 34U being interposed therebetween. The third electrode 38U may be electrically coupled to the first electrode 32L through the contact hole H2 provided in each of the third insulating film 37, the second insulating film 36, and the first insulating film 33. In this manner, the contact hole H2 may couple the source-drain electrode 38B to the low-resistance region 34b of the oxide semiconductor film 34. The contact hole H2 may also couple the third electrode 38U to the first electrode 32L. That is, the contact hole H2 may be a so-called shared contact. As described later, the third electrode 38U may be formed by the same steps as those of each of the source-drain electrodes 38A and 38B of the cut-off transistor Tr3 (driving transistor Tr1 and switching transistor Tr2), for example. The third electrode 38U may be made of a constituent material the same as that of each of the source-drain electrodes 38A and 38B, and may have the same thickness as that of each of the source-drain electrodes 38A and 38B. The third electrode 38U may be electrically coupled to the source-drain electrode 38B of the cut-off transistor Tr3. For example, the third electrode 38U and the source-drain electrode 38B of the cut-off transistor Tr3 may be integrally formed. The third electrode 38U may be covered with the interlayer insulating film 39.

The electrically conductive film 38C illustrated in FIG. 5B that serves to electrically couple the second electrode 34U and the gate electrode 32 of the driving transistor Tr1 to each other may be formed by the same steps as those of each of the source-drain electrodes 38A and 38B, for example. The electrically conductive film 38C may be made of a constituent material the same as that of each of the source-drain electrodes 38A and 38B, and may have the same thickness as that of each of the source-drain electrodes 38A and 38B. The electrically conductive film 38C may be in contact with the second electrode 34U and the gate electrode 32 of the driving transistor Tr1 at different positions.

[Display Element Layer 40]

The display element layer 40 may include the plurality of pixels 11 and the organic EL element 13. The organic EL element 13 may be driven by the driving transistor Tr1, the switching transistor Tr2, and the cut-off transistor Tr3 to perform display.

[Manufacturing Method]

The display unit 1 as described above may be manufactured, for example, as follows. FIGS. 8A to 9B illustrate a manufacturing process of the display unit 1 in order of steps. It is to be noted that description of a thermal process, for example, is omitted in the following description.

Figure 8A:
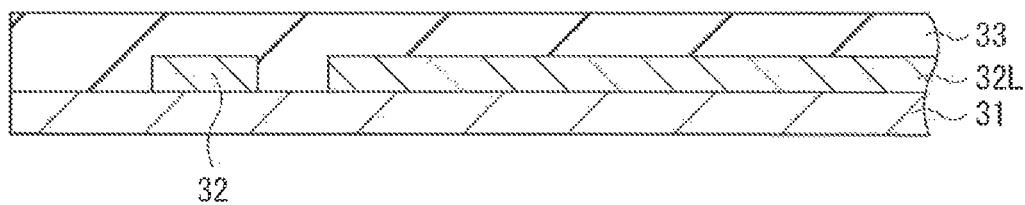
FIG. 8A is a schematic cross-sectional view of one step of a manufacturing method of the semiconductor device illustrated in FIG. 6.

First, the gate electrode 32 and the first electrode 32L may be formed on the substrate 31 in the same step, and thereafter the first insulating film 33 may be formed to cover the gate electrode 32 and the first electrode 32L as illustrated in FIG. 8A. More specifically, the following steps may be taken. First, a sputtering method may be used to form, for example, a titanium film, an aluminum film, and a titanium film in this order on the substrate 31 to form a stacked metal film. Thereafter, the stacked film may be processed, for example, by photolithography and etching to form the gate electrode 32 and the first electrode 32L each having a desired shape. As for the etching, for example, dry etching using a chlorine (Cl)-based gas may be performed. Thereafter, a chemical vapor deposition (CVD) method, for example, may be used to form, on the entire surface of the substrate 31, a silicon nitride film having a thickness of about 200 nm and a silicon oxide film having a thickness of about 100 nm in this order, thus forming the first insulating film 33. Silicon hydride (SiH$_4$) may be used, for example, as a process gas for formation of the silicon nitride film.

Figure 8B:
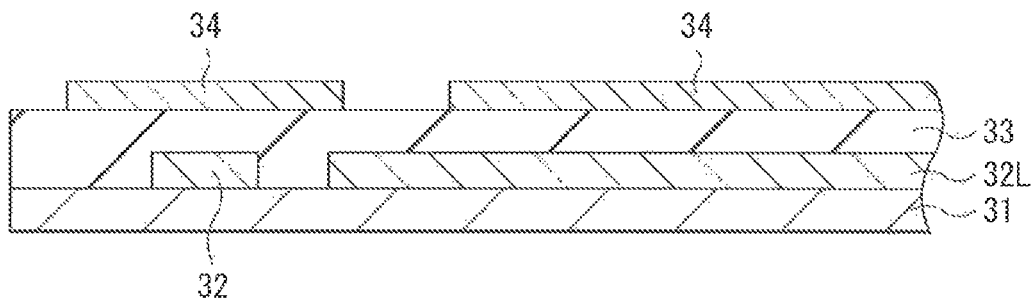
FIG. 8B is a schematic cross-sectional view of a step subsequent to FIG. 8A.

After the formation of the first insulating film 33, the oxide semiconductor film 34 may be formed in an island shape in each of regions corresponding to the gate electrode 32 and the first electrode 32L, as illustrated in FIG. 8B. More specifically, first, an oxide semiconductor material may be formed on the first insulating film 33 using the sputtering method, for example. Thereafter, the oxide semiconductor material may be processed by the photolithography and the etching. In this situation, an annealing treatment may be performed in an atmosphere that contains oxygen for the purpose of, for example, adjusting carrier concentration of the oxide semiconductor film 34.

Figure 8C:
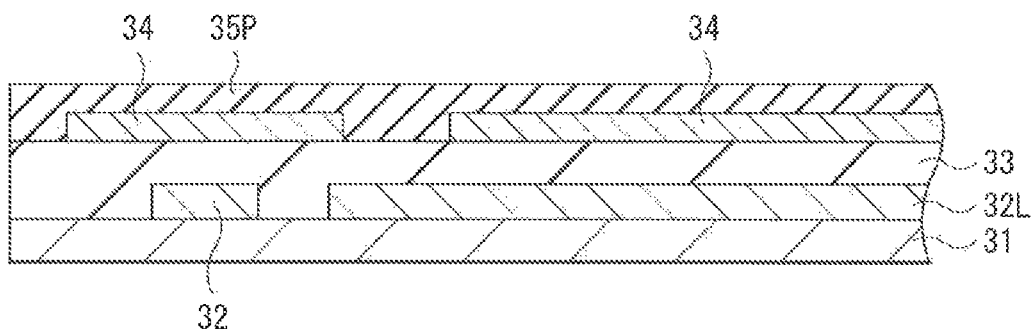
FIG. 8C is a schematic cross-sectional view of a step subsequent to FIG. 8B.

Subsequently, the CVD method, for example, may be used to form a silicon oxide film having a thickness of about 150 nm on the entire surface of the substrate 31 to cover the oxide semiconductor film 34. This allows for formation of a channel protective material film 35P that forms the channel protective film 35, as illustrated in FIG. 8C.

Figure 8D:
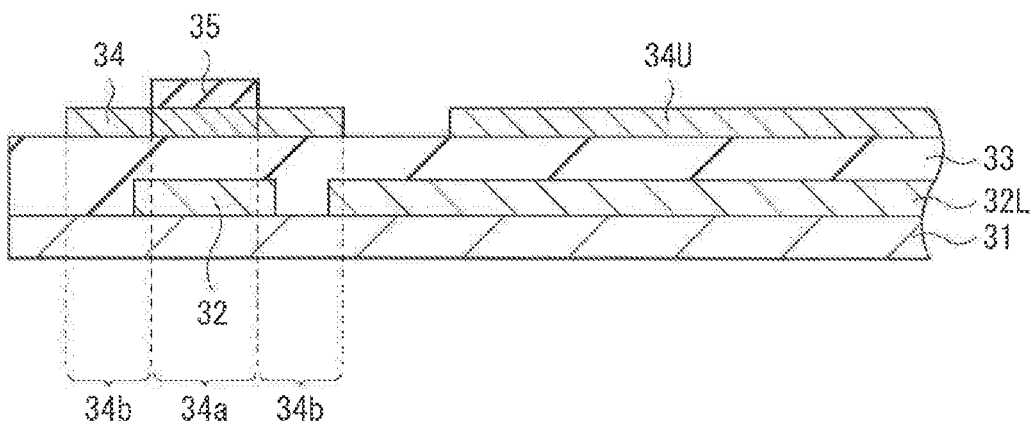
FIG. 8D is a schematic cross-sectional view of a step subsequent to FIG. 8C.

Thereafter, as illustrated in FIG. 8D, the channel protective material film 35P may be patterned to form the channel protective film 35. The patterning of the channel protective material film 35P may be performed in a self-aligned manner by means of back exposure using the pattern of the gate electrode 32 as a mask. More specifically, the following steps may be taken. First, a positive photoresist may be applied onto the entire surface of the substrate 31 using a spinning method, for example. Next, after application of a treatment such as prebaking, entire-surface exposure may be performed from back-surface side of the substrate 31 using, as masks, patterns of the gate electrode 32 and the first electrode 32L. This allows a pattern of the photoresist to be formed in a self-aligned manner. Subsequently, in order to remove the photoresist on the first electrode 32L, exposure may be performed from the back-surface side of the substrate 31 using a regular mask. Thereafter, etching of the channel protective material film 35P may be performed. As the etching, for example, dry etching using a carbon tetrafluoride (CF$_4$)-based gas may be used. Application of such dry etching causes a region of the oxide semiconductor film 34, that is exposed from the channel protective film 35 to be damaged to have a lower resistance. This allows for formation of the low-resistance region 34b in the oxide semiconductor film 34 that faces the gate electrode 32 as well as formation of the second electrode 34U that faces the first electrode 32L. That is, the low-resistance region 34b may be formed in a self-aligned manner in the cut-off transistor Tr3 (driving transistor Tr1 and switching transistor Tr2). The low-resistance region 34b of the oxide semiconductor film 34 and the second electrode 34U may be slightly etched together with the channel protective material film 35P, and thus may be thinner than the channel region 34a of the oxide semiconductor film 34.

Figure 9A:
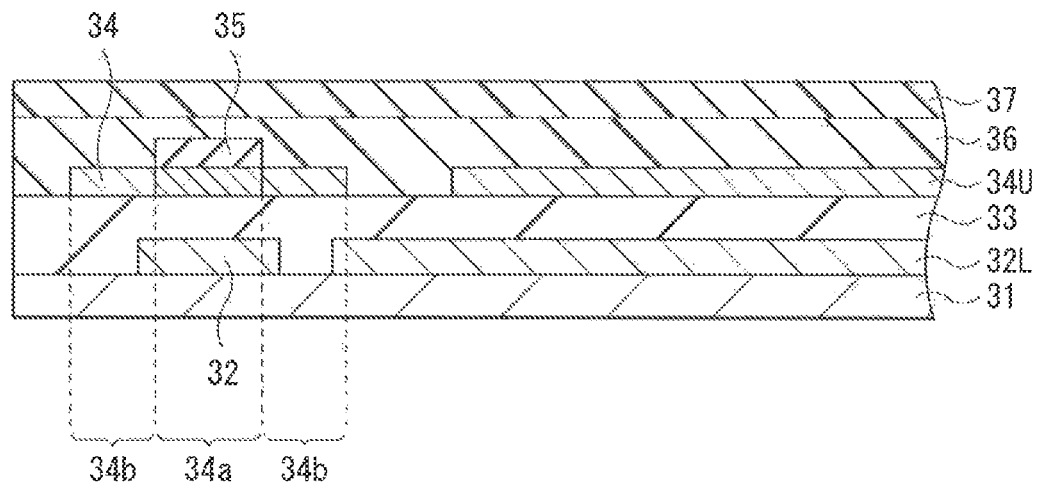
FIG. 9A is a schematic cross-sectional view of a step subsequent to FIG. 8D.

After the formation of the channel protective film 35, the second insulating film 36 and the third insulating film 37 may be formed in this order as illustrated in FIG. 9A. As the second insulating film 36, for example, an aluminum oxide ($Al_2O_3$) film having a thickness of about 20 nm may be formed using the sputtering method. As the third insulating film 37, a silicon oxide film having a thickness of about 200 nm may be formed using the CVD method.

Figure 9B:
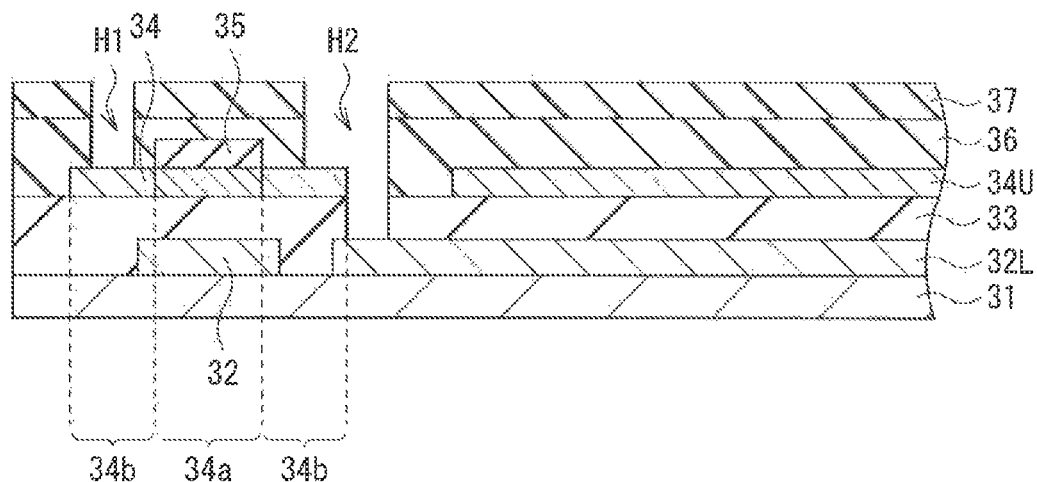
FIG. 9B is a schematic cross-sectional view of a step subsequent to FIG. 9A.

Thereafter, as illustrated in FIG. 9B, the contact holes H1 and H2 (as well as contact holes H3 to H5) may be formed. The contact hole H1 (contact holes H3 and H4) may reach the low-resistance region 34b of the oxide semiconductor film 34. The contact hole H2 may be formed to reach the low-resistance region 34b of the oxide semiconductor film 34 as well as the first electrode 32L. The contact hole H5 may be formed to reach the second electrode 34U as well as the first electrode 32L. The contact holes H1 to H5 may be formed by photolithography and etching, for example. As for the etching, for example, dry etching using the $CF_4$-based gas may be performed.

After the formation of the contact holes H1 to H5, the source-drain electrodes 38A and 38B, the third electrode 38U, and the electrically conductive film 38C may be formed to fill the contact holes H1 to H5 in the same steps. More specifically, the following steps may be taken. First, the sputtering method may be used to form, for example, a titanium film, an aluminum film, and a titanium film in this order on the third insulating film 37 to form a stacked metal film. Thereafter, the stacked film may be processed, for example, by the photolithography and the etching to form the source-drain electrodes 38A and 38B, the third electrode 38U, and the electrically conductive film 38C each having a desired shape. As for the etching, for example, dry etching using the Cl-based gas may be performed. After the formation of the source-drain electrodes 38A and 38B, the interlayer insulating film 39 may be formed.

In this manner, after the formation of the semiconductor device 30, for example, the anode electrode 41, the organic layer, and the cathode electrode may be formed in this order on the semiconductor device 30 to form the display element layer 40. This completes the display unit 1 illustrated in FIG. 1.

[Workings and Effects]

In the display unit 1, a selection pulse is supplied to the switching transistor Tr2 of each of the pixels 11 to select a pixel. The signal voltage Vsig corresponding to the image signal 20A is supplied to the selected pixel, and is stored in the holding capacitor Cs. The driving transistor Tr1 is subjected to the on/off control in response to the signal held by the holding capacitor Cs, and a drive current is injected into each of the organic EL elements 13. This allows for light emission of the display element layer 40, thus causing color beams to be extracted from the respective pixels. Additive color mixture of the color beams allows color image display to be performed.

In the semiconductor device 30 of the present example embodiment, the cut-off transistor Tr3 (driving transistor Tr1 and switching transistor Tr2) may be each the bottom-gate thin film transistor, and may each have the self-aligned structure. This enables the parasitic capacitance to be smaller. This is described hereinafter.

Figure 10:
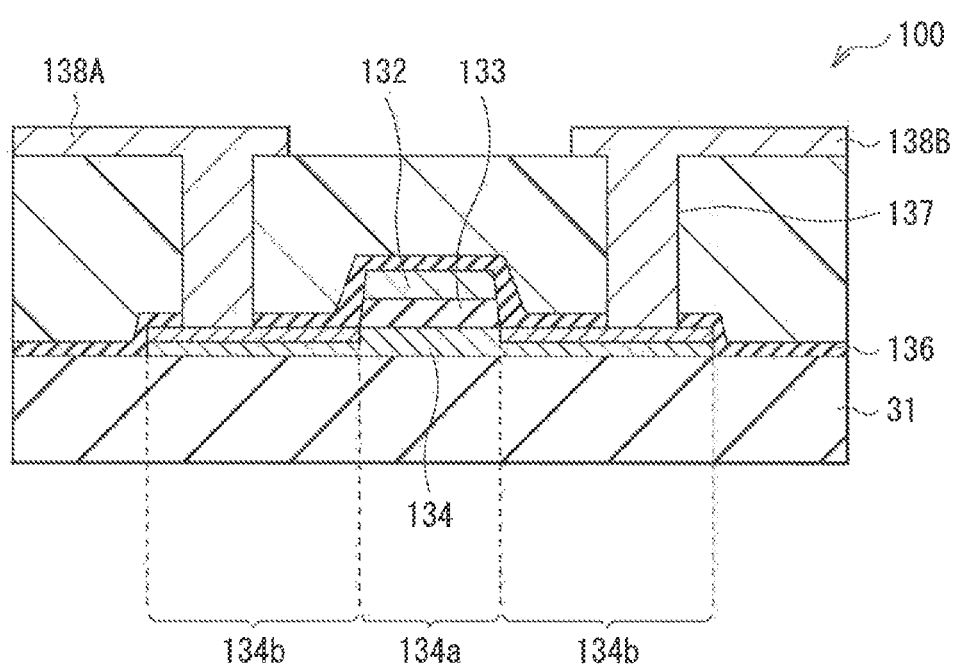
FIG. 10 is a schematic cross-sectional view of a configuration of a transistor according to Comparative Example 1.

FIG. 10 schematically illustrates a cross-sectional configuration of a transistor according to Comparative Example 1, i.e., a transistor 100. The transistor 100 is a top-gate thin film transistor. The transistor 100 includes, on the substrate 31, an oxide semiconductor film 134, a first insulating film 133, a gate electrode 132, a second insulating film 136, a third insulating film 137, and source-drain electrodes 138A and 138B in this order. The transistor 100 has the self-aligned structure, and the first insulating film 133 and the gate electrode 132 have the same shape as each other in a plan view. The oxide semiconductor film 134 includes a channel region 134a that faces the gate electrode 132, and a low-resistance region 134b provided on both sides of the channel region 134a.

In such a transistor 100, a leak current is likely to occur between the gate electrode 132 and the low-resistance region 134b of the oxide semiconductor film 134, due to the first insulating film 133 and the gate electrode 132 provided substantially vertical relative to the oxide semiconductor film 134. Further, there is also a possibility that a crack defect may occur in the second insulating film 136 that covers the gate electrode 132 and the first insulating film 133. As a result, it becomes difficult to improve yield of the transistor 100.

In addition, in a case where a holding capacitor is configured by a first electrode formed in the same steps as those of the oxide semiconductor film 134 and by a second electrode formed in the same steps as those of the gate electrode 132, it is difficult to stably maintain electric resistance of the first electrode. It is conceivable that the bottom-gate thin film transistor may be used instead of the top-gate thin film transistor. In this case, however, the parasitic capacitance is likely to be larger.

In contrast, the semiconductor device 30 may include the bottom-gate cut-off transistor Tr3 (driving transistor Tr1 and switching transistor Tr2) that is formed in a self-aligned manner. That is, the gate electrode 32 and the low-resistance region 34b may have a smaller overlapping region in a plan view. Further, the cur-off transistor Tr3 may have the sufficiently large first insulating film 33 being interposed between the gate electrode 32 and the oxide semiconductor film 34. Thus, it becomes possible to suppress a leak current that occurs between the gate electrode 32 and the low-resistance region 34b of the oxide semiconductor film 34. Furthermore, it is sufficient for the second insulating film 36 to be able to cover only height of the channel protective film 35. Thus, a crack is less likely to occur in the second insulating film 36 than in the second insulating film 136 that covers the first insulating film 133 and the gate electrode 132. Hence, it becomes possible to improve the yield in the semiconductor device 30, while reducing the parasitic capacitance because of the self-aligned structure.

Moreover, in the cut-off transistor Tr3 (driving transistor Tr1 and switching transistor Tr2) in which such parasitic capacitance is reduced, it is possible to allow a region necessary for formation of the holding capacitor Cs to be smaller. That is, it is possible to achieve higher definition.

Further, it is possible to easily lower the resistance of the second electrode 34U that is formed in the same steps as those of the oxide semiconductor film 34, thus making it possible to stably maintain the low-resistance state of the second electrode 34U. Hence, it becomes possible to stably hold the capacitance between the first electrode 32L and the second electrode 34U.

As has been described hereinabove, in the present example embodiment, use of the bottom-gate cut-off transistor Tr3 (driving transistor Tr1 and switching transistor Tr2) having the self-aligned structure enables the parasitic capacitance to be smaller without lowering the yield.

Further, in the semiconductor device 30, an insulating film (such as an oxide film) having a high barrier property against hydrogen and moisture, for example, may be used as the second insulating film 36 that is in contact with the low-resistance region 34b of the oxide semiconductor film 34. This allows the low-resistance region 34b of the oxide semiconductor film 34 to stably maintain the low-resistance state. This further leads to stabilization of the characteristics of the cut-off transistor Tr3 (driving transistor Tr1 and switching transistor Tr2). Hence, it becomes possible to improve the reliability of the semiconductor device 30.

Moreover, the holding capacitor Cs of the semiconductor device 30 may be a capacitative element having a stacked structure, and thus is able to hold a larger capacitance per small area. Hence, together with the cut-off transistor Tr3 (driving transistor Tr1 and switching transistor Tr2) in which the parasitic resistance is reduced, the holding capacitor Cs contributes greatly to the higher definition.

It is possible to form the first electrode 32L, the second electrode 34U, and the third electrode 38U of the holding capacitor Cs in the same steps as those of, respectively, the gate electrode 32, the oxide semiconductor film 34, and the source-drain electrodes 38A and 38B of the cut-off transistor Tr3 (driving transistor Tr1 and switching transistor Tr2). In this manner, it is possible to manufacture the semiconductor device 30 in a simple manner by suppressing increase in steps of the photolithography. Hence, it becomes possible to suppress a manufacturing cost.

Figure 11:
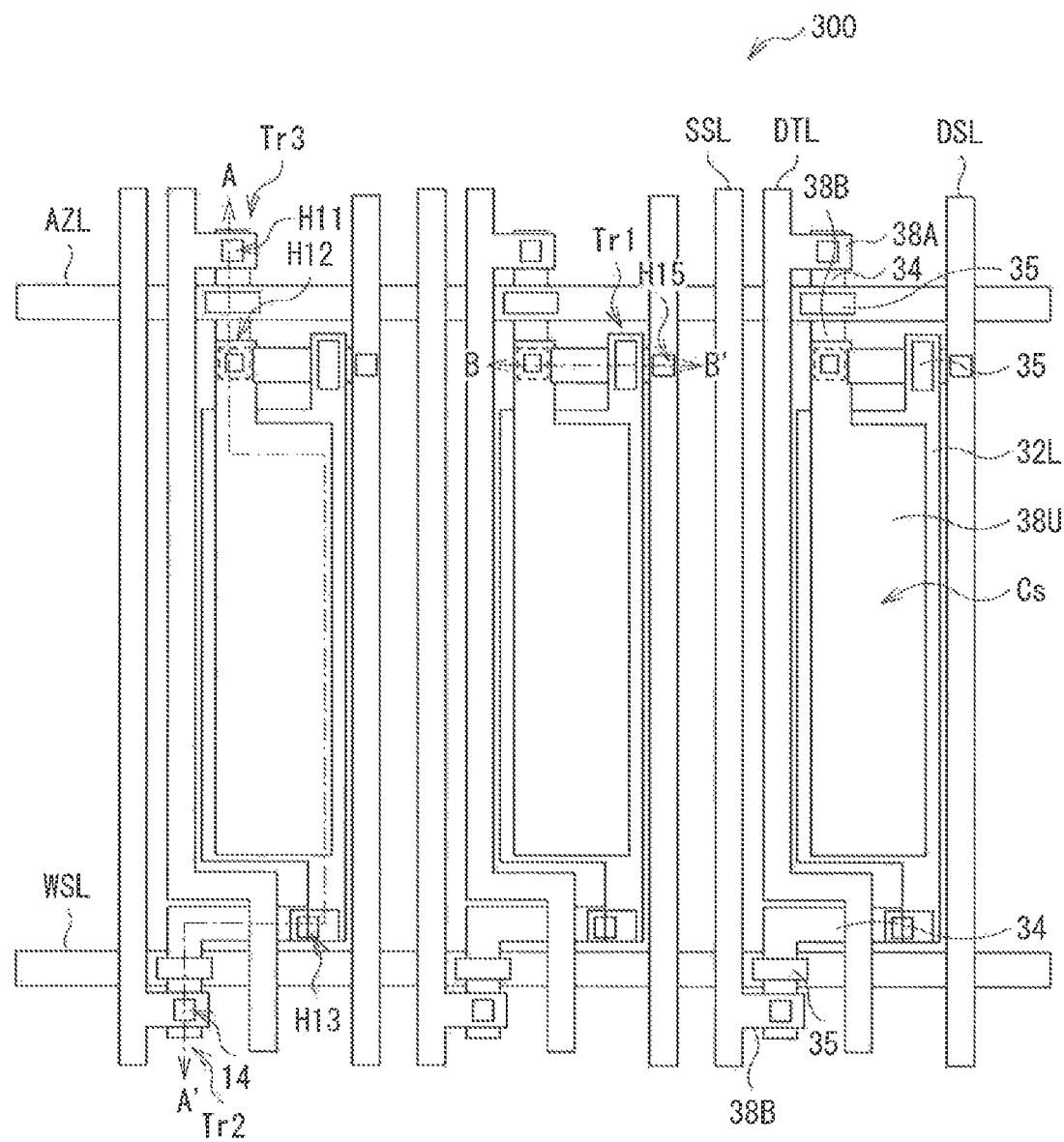
FIG. 11 is a plan view of a schematic configuration of a semiconductor device according to Comparative Example 2.
Figure 12A:
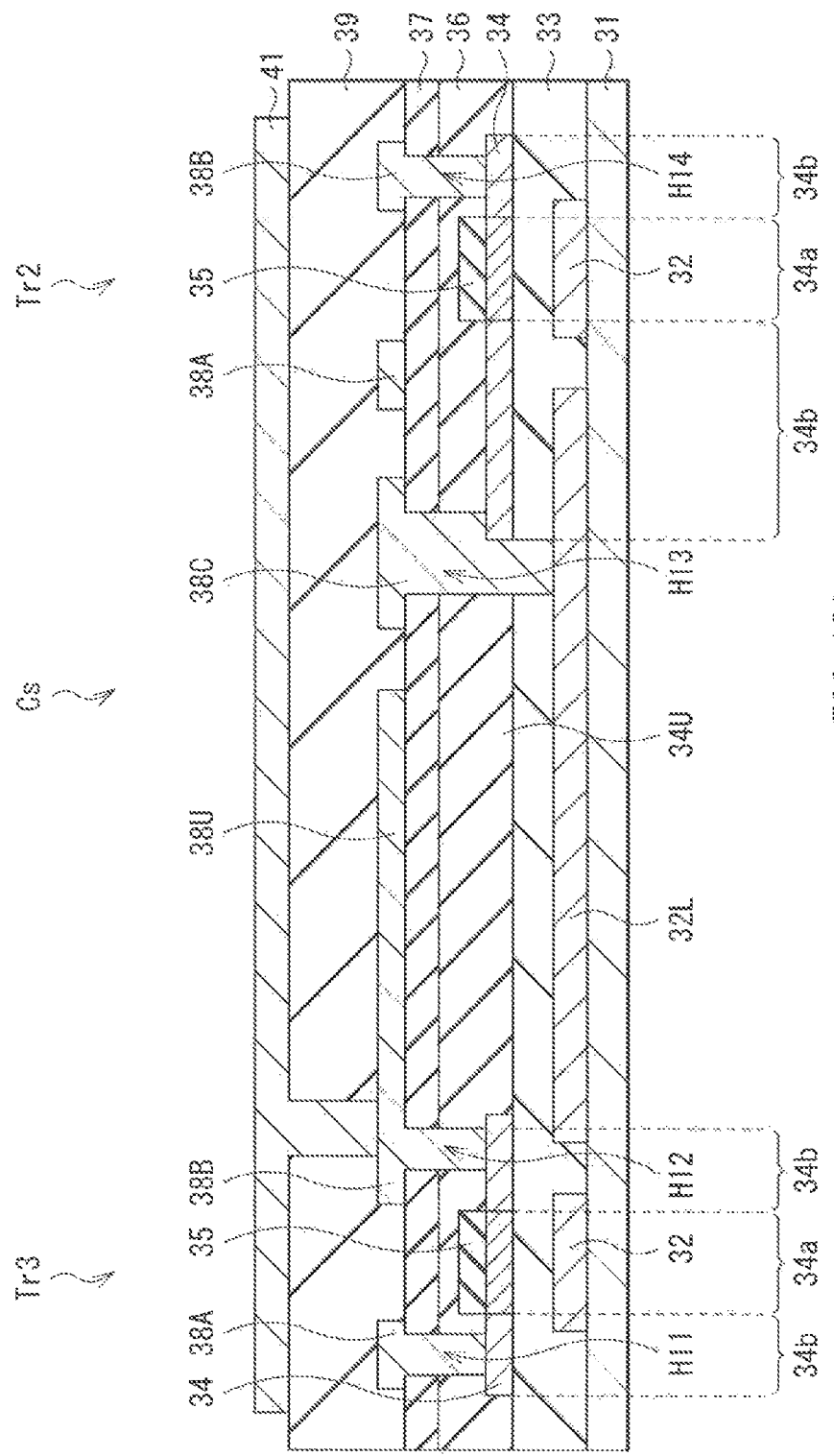
FIG. 12A illustrates a cross-sectional configuration of the semiconductor device illustrated in FIG. 11 taken along a line A-A'.
Figure 12B:
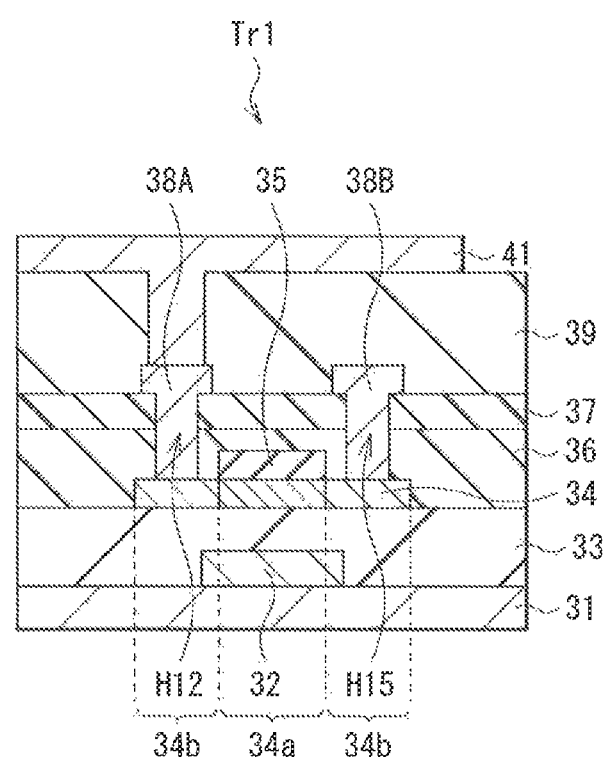
FIG. 12B illustrates a cross-sectional configuration of the semiconductor device illustrated in FIG. 11 taken along a line B-B'.
Figure 13:
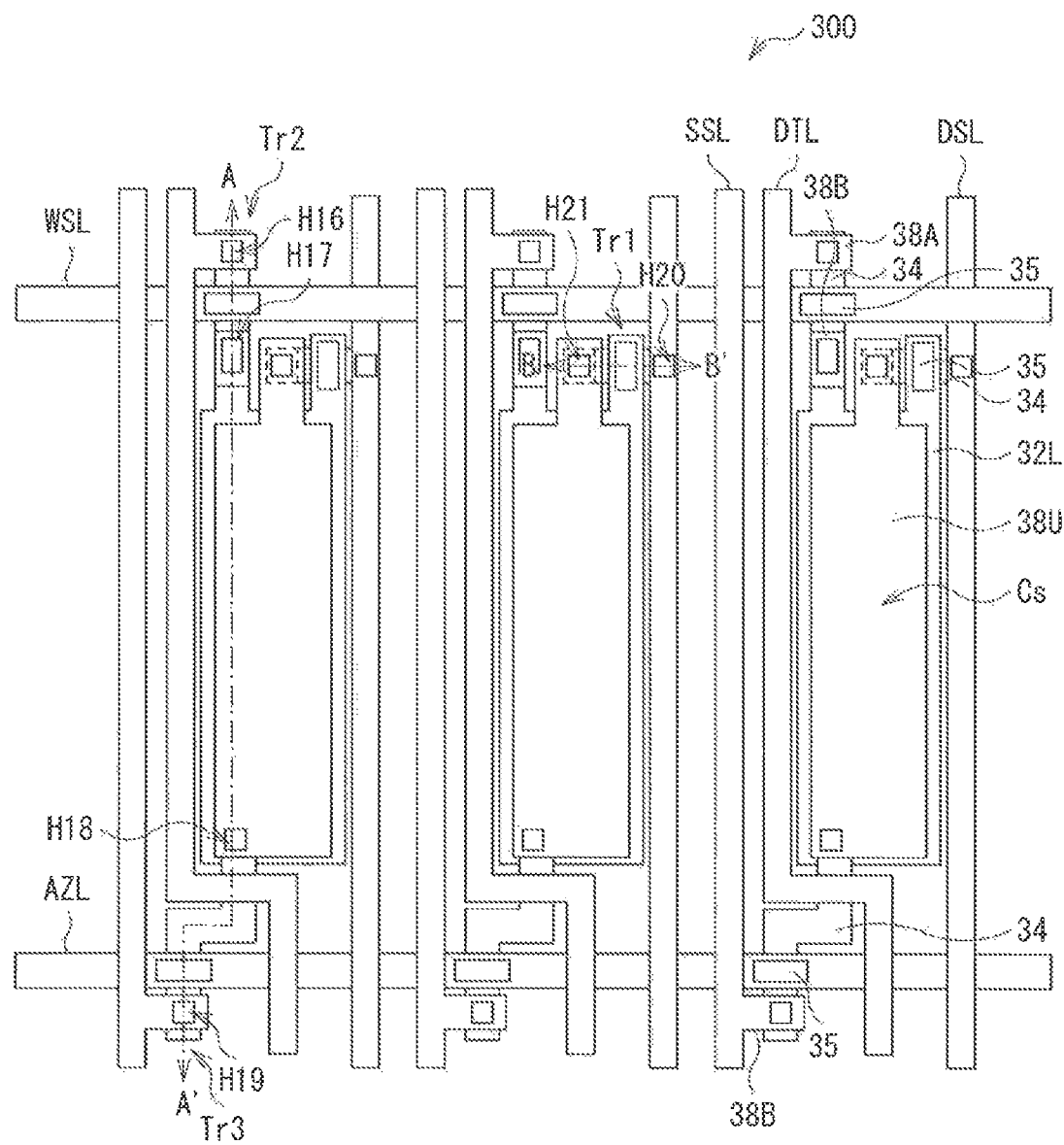
FIG. 13 is a plan view of another example of the semiconductor device illustrated in FIG. 11.
Figure 14A:
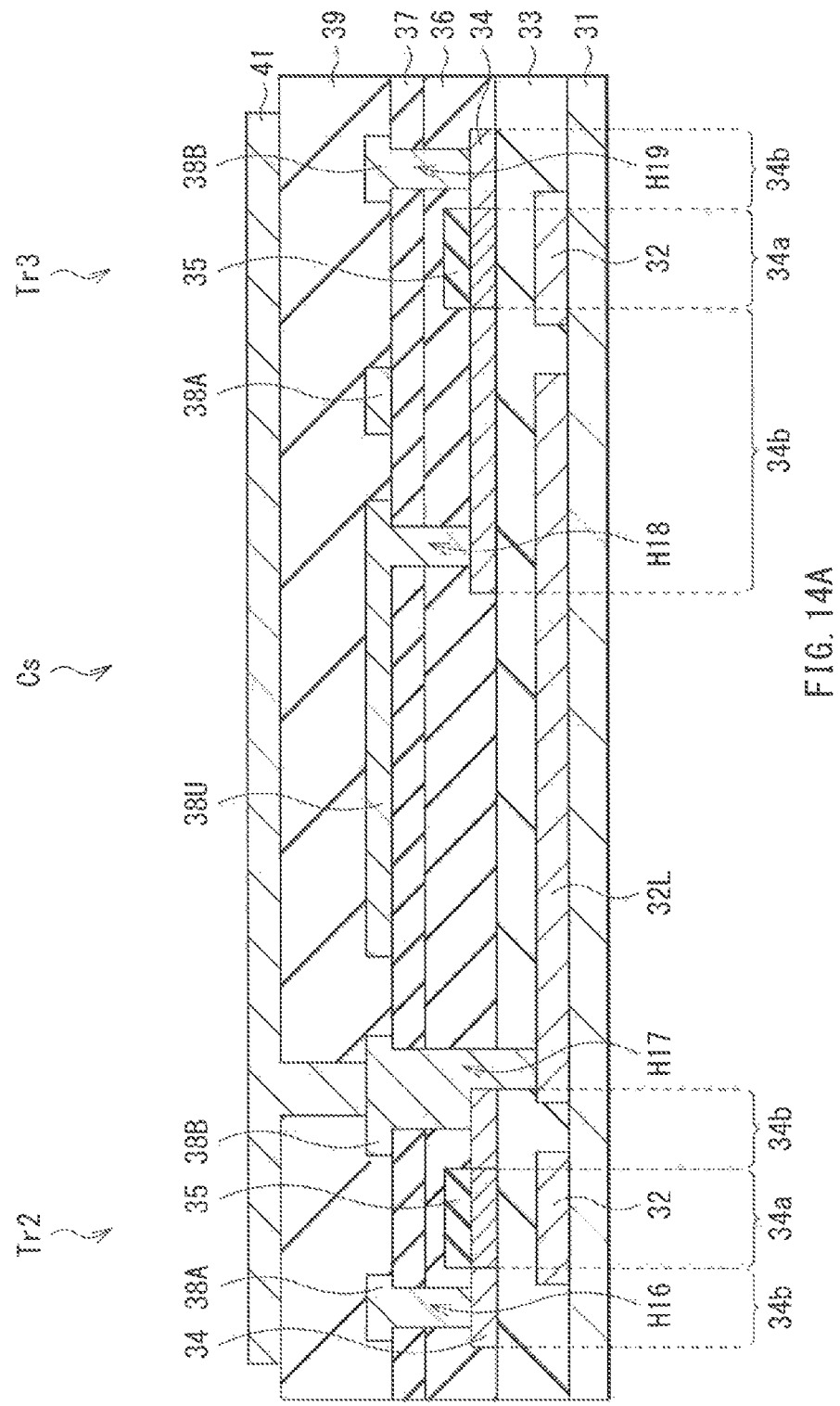
FIG. 14A illustrates a cross-sectional configuration of the semiconductor device illustrated in FIG. 13 taken along a line A-A'.
Figure 14B:
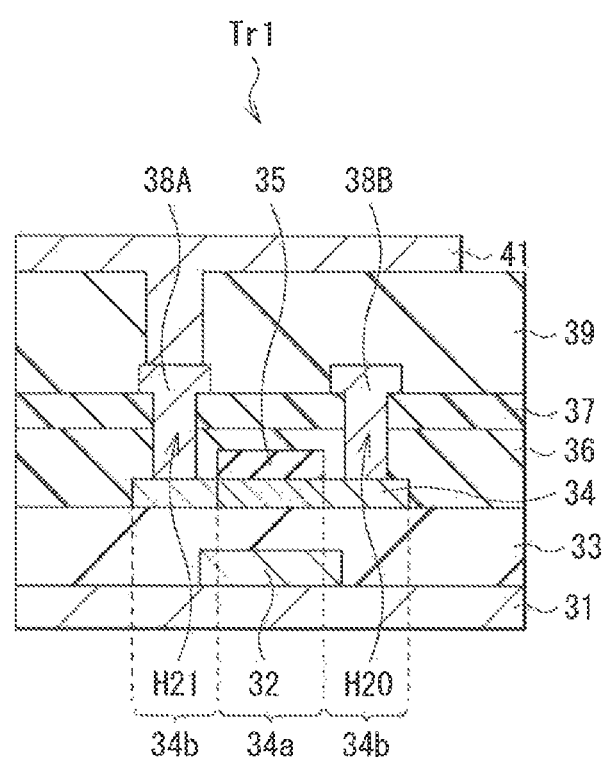
FIG. 14B illustrates a cross-sectional configuration of the semiconductor device illustrated in FIG. 13 taken along a line B-B'.

As illustrated in FIGS. 11 to 12B, for example, it is also conceivable that the holding capacitor Cs may have a non-stacked structure. FIG. 11 illustrates a planar configuration of a semiconductor device 300 according to Comparative Example 2. FIG. 12A illustrates a cross-sectional configuration of the semiconductor device 300 taken along a line A-A' illustrated in FIG. 11. FIG. 12B illustrates a cross-sectional configuration of the semiconductor device 300 taken along a line B-B' illustrated in FIG. 11. Further, FIGS. 13 to 14B illustrate another embodiment of the semiconductor device 300. FIG. 14A illustrates a cross-sectional configuration of the semiconductor device 300 taken along a line A-A' illustrated in FIG. 13. FIG. 14B illustrates a cross-sectional configuration of the semiconductor device 300 taken along a line B-B' illustrated in FIG. 13.

The holding capacitor Cs of the semiconductor device 300 is configured by the first electrode 32L and the third electrode 38U. The first insulating film 33, the second insulating film 36, and the third insulating film 37 are interposed between the first electrode 32L and the third electrode 38U. In such a semiconductor device 300, the capacitance is held only between the first electrode 32L and the third electrode 38U, thus resulting in increased areas of the first electrode 32L and the third electrode 38U in order to hold a sufficient capacitance. Hence, it becomes difficult to achieve the higher definition.

In contrast, in the semiconductor device 30, the second electrode 34U may be interposed between the first electrode 32L and the third electrode 38U, and the third electrode 38U may be coupled to the first electrode 32L, thus allowing for formation of the stacked holding capacitor Cs. This makes it possible to hold a larger capacitance per small area. Hence, it becomes possible to achieve the higher definition.

Description is given below of a modification example of the present example embodiment. In the following description, the same reference numerals are assigned to the same components as those of the foregoing example embodiment, and descriptions thereof are omitted where appropriate.

[Modification Example 1]

Figure 15:
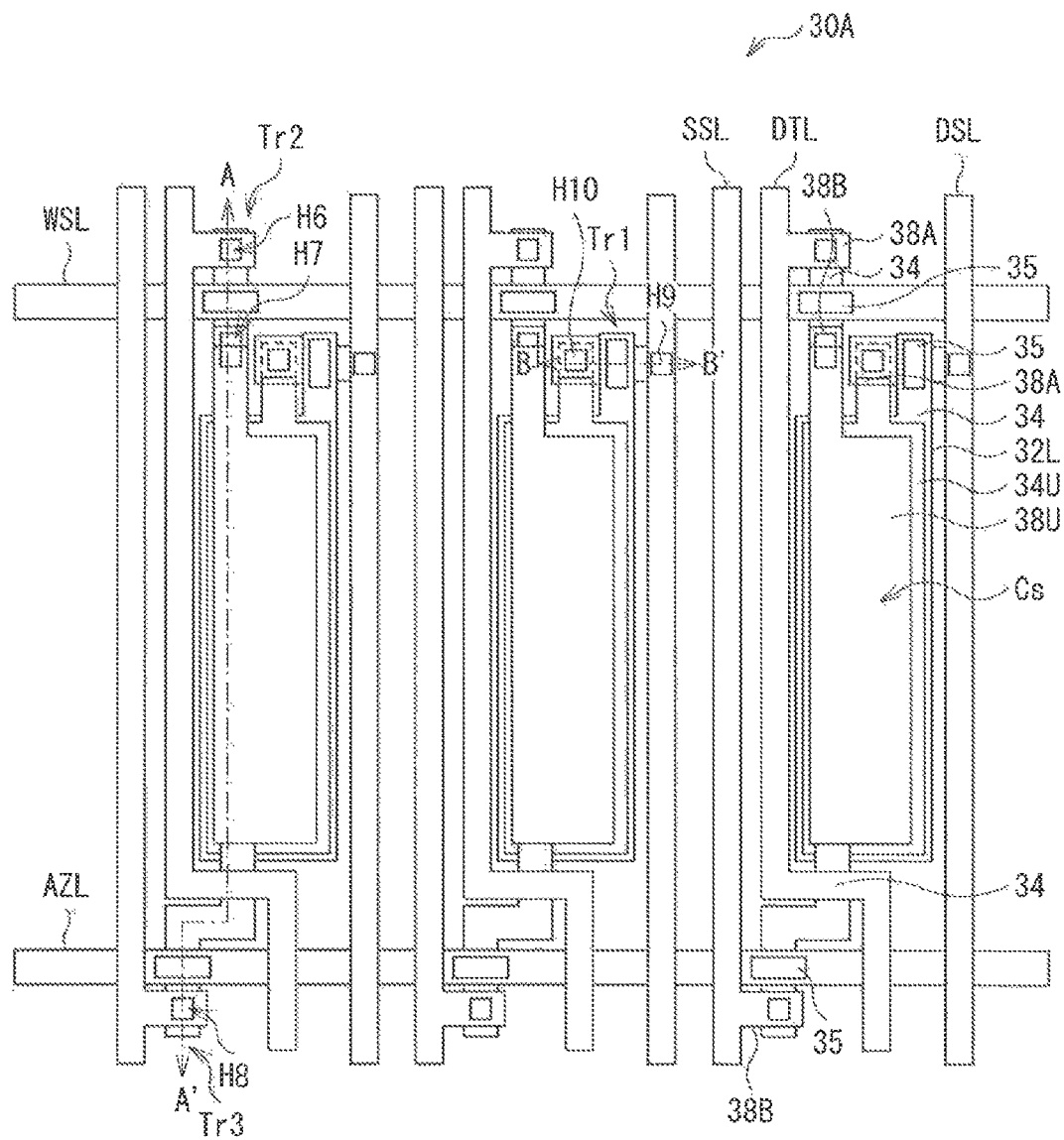
FIG. 15 is a plan view of a schematic configuration of a semiconductor device according to a modification example.
Figure 16A:
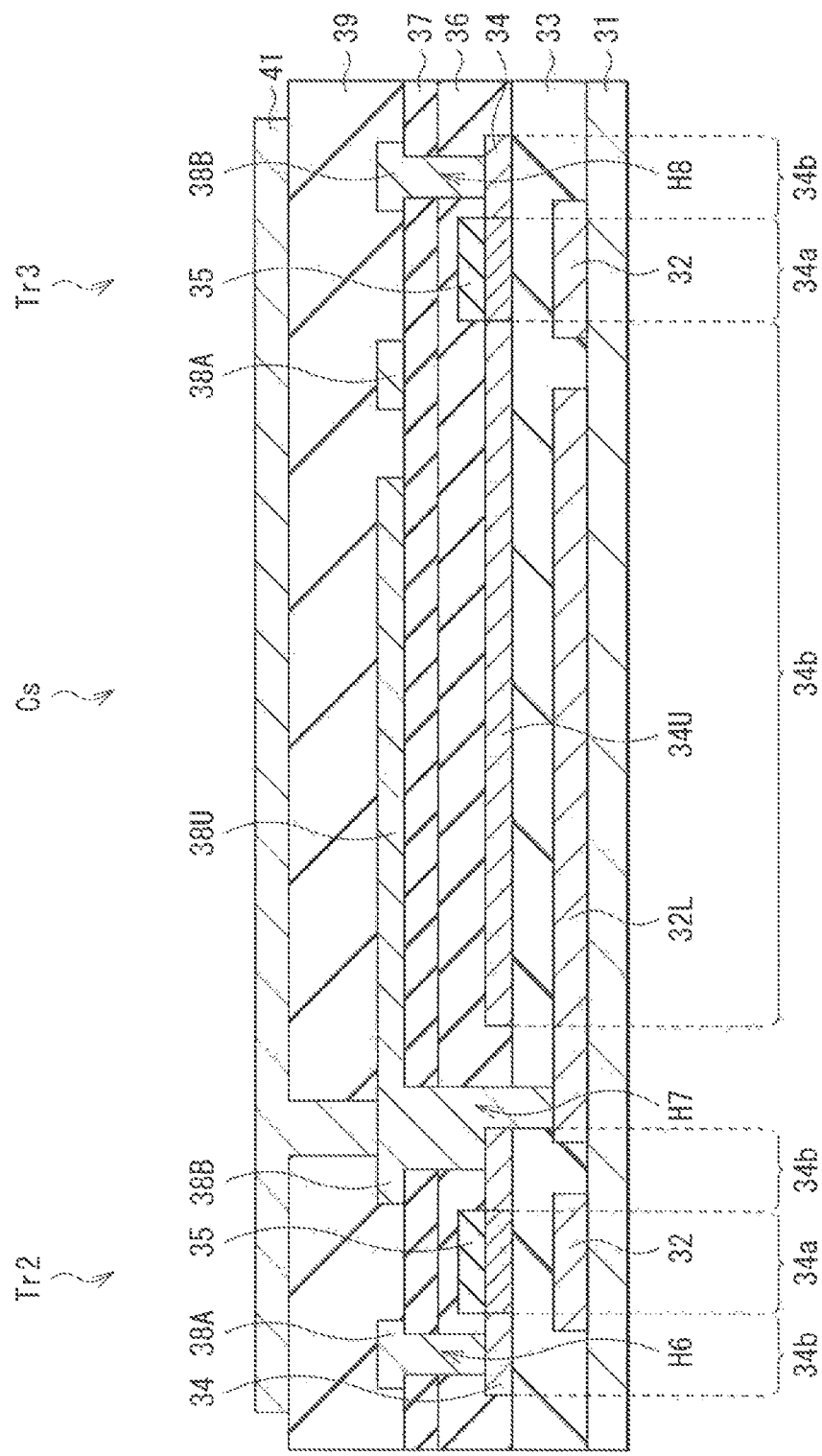
FIG. 16A illustrates a cross-sectional configuration of the semiconductor device illustrated in FIG. 15 taken along a line A-A'.
Figure 16B:
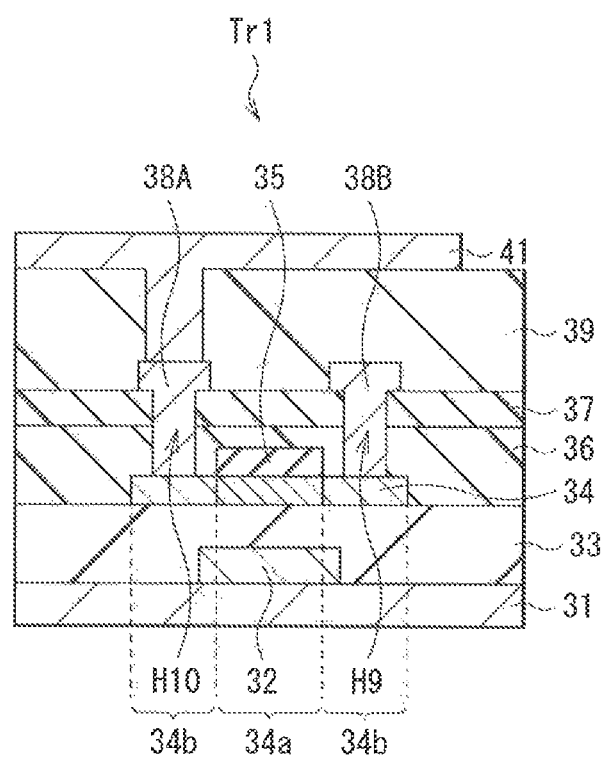
FIG. 16B illustrates a cross-sectional configuration of the semiconductor device illustrated in FIG. 15 taken along a line B-B'.

FIG. 15 illustrates a planar configuration of a semiconductor device, i.e., a semiconductor device 30A according to Modification Example 1 of the foregoing example embodiment. FIG. 16A illustrates a cross-sectional configuration of the semiconductor device 30A taken along a line A-A' illustrated in FIG. 15. FIG. 16B illustrates a cross-sectional configuration of the semiconductor device 30A taken along a line B-B' illustrated in FIG. 15. In the semiconductor device 30A, the oxide semiconductor film 34 of the driving transistor Tr1 and the second electrode 34U of the holding capacitor Cs may be electrically coupled to each other, and may be integrally provided. The oxide semiconductor film 34 of the driving transistor Tr1 and the oxide semiconductor film 34 of the cut-off transistor Tr3 may be integrally provided. The third electrode 38U of the holding capacitor Cs may be electrically coupled to the source-drain electrode 38B of the switching transistor Tr2, and the third electrode 38U of the holding capacitor Cs and the source-drain electrode 38B of the switching transistor Tr2 may be integrally provided. Except this point, the semiconductor device 30A has the same configuration as that of the semiconductor device 30, and also has similar workings and similar effects to those of the semiconductor device 30.

The source-drain electrodes 38A and 38B of the switching transistor Tr2 may be electrically coupled to the oxide semiconductor film 34 through contact holes H6 and H7, respectively. The contact hole H7 may couple the source-drain electrode 38B to the low-resistance region 34b of the oxide semiconductor film 34. The contact hole H7 may also couple the third electrode 38U to the first electrode 32L. That is, the contact hole H7 may be the so-called shared contact.

The source-drain electrode 38B of the cut-off transistor Tr3 may be electrically coupled to the oxide semiconductor film 34 through a contact hole H8. The source-drain electrodes 38A and 38B of the driving transistor Tr1 may be electrically coupled to the oxide semiconductor film 34 through contact holes H10 and H9, respectively. The gate electrode 32 of the driving transistor Tr1 may be electrically coupled to the first electrode 32L of the holding capacitor Cs, and the gate electrode 32 of the driving transistor Tr1 and the first electrode 32L of the holding capacitor Cs may be integrally provided.

[Functional Configuration Example]

Figure 17:
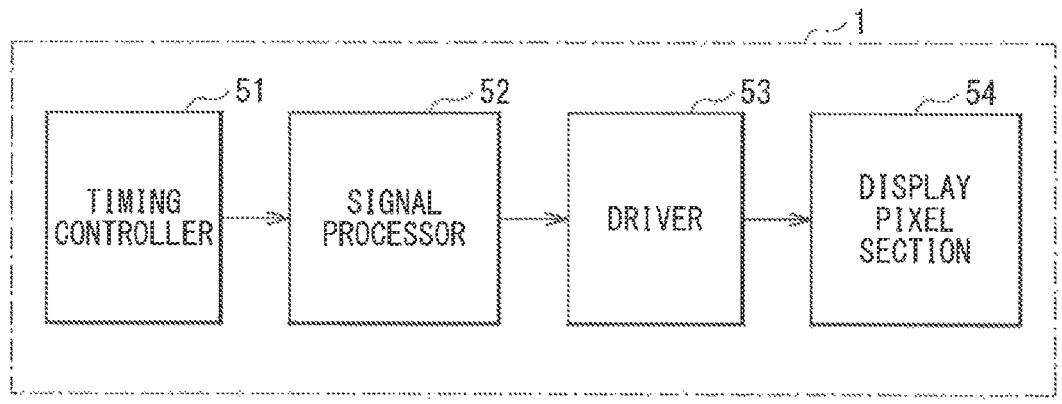
FIG. 17 is a block diagram illustrating a functional configuration of the display unit.

FIG. 17 illustrates a functional block configuration of the display unit 1 described in the foregoing example embodiment, etc.

The display unit 1 may display, as an image, an image signal inputted from the outside or generated inside the display unit 1. The display unit 1 may also be applied to a liquid crystal display, for example, aside from the above-described organic EL display. The display unit 1 may include, for example, a timing controller 51, a signal processor 52, a driver 53, and a display pixel section 54.

The timing controller 51 may include a timing generator that generates various timing signals, i.e., control signals. The timing controller 51 may control driving of the signal processor 52, for example, on the basis of the various timing signals. The signal processor 52 may perform a predetermined correction on, for example, the digital image signal inputted from the outside, and may output the thus-obtained image signal to the driver 53. The driver 53 may include circuits such as a scanning line drive circuit and a signal line drive circuit, for example. The driver 53 may drive each pixel of the display pixel section 54 through various control lines. The display pixel section 54 may include, for example, a display element, i.e., the above-described display element layer 40 and a pixel circuit. Examples of the display element may include an organic EL element and a liquid crystal display element. The pixel circuit may be provided to drive the display element for each of the pixels 11. Each of the above-described semiconductor devices 30 and 30A may be used, for example, for various circuits constituting a portion of the driver 53 or a portion of the display pixel section 54, among the above-described components.

[Application Example Other than Display Unit]

Figure 18:
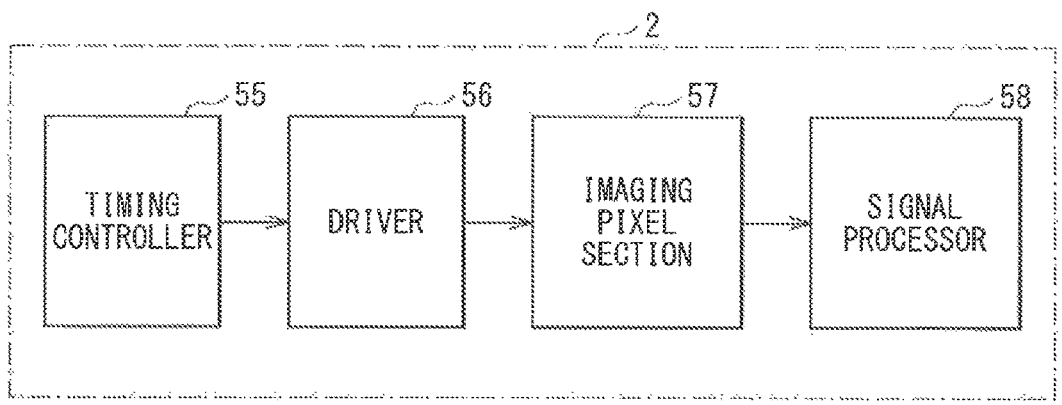
FIG. 18 is a block diagram illustrating a configuration of an imaging unit.

The description has been given, in the foregoing example embodiment, etc., referring to the display unit 1 as the application example of the semiconductor devices 30 and 30A. However, the semiconductor devices 30 and 30A may also be used for an imaging unit, i.e., an imaging unit 2 illustrated in FIG. 18, aside from the display unit 1.

The imaging unit 2 may be a solid-state imaging unit that obtains an image, for example, as an electric signal. The imaging unit 2 may be configured by, for example, a charge coupled device (CCD) image sensor or a complementary metal oxide semiconductor (CMOS) image sensor. The imaging unit 2 may include, for example, a timing controller 55, a driver 56, an imaging pixel section 57, and a signal processor 58.

The timing controller 55 may include a timing generator that generates various timing signals, i.e., control signals. The timing controller 55 may control driving of the driver 56 on the basis of the various timing signals. The driver 56 may include, for example, a row selection circuit, an AD conversion circuit, and a horizontal transfer scanning circuit. The driver 56 may perform driving to read a signal from each pixel of the imaging pixel section 57 through various control lines. The imaging pixel section 57 may include, for example, an imaging element, i.e., a photoelectric conversion element such as a photodiode, and a pixel circuit for reading of a signal. The signal processor 58 may apply various signal processings to the signal obtained from the imaging pixel section 57. Each of the above-described semiconductor devices 30 and 30A may be used, for example, for various circuits constituting a portion of the driver 56 or a portion of the imaging pixel section 57, among the above-described components.

[Examples of Various Electronic Apparatuses]

Figure 19:
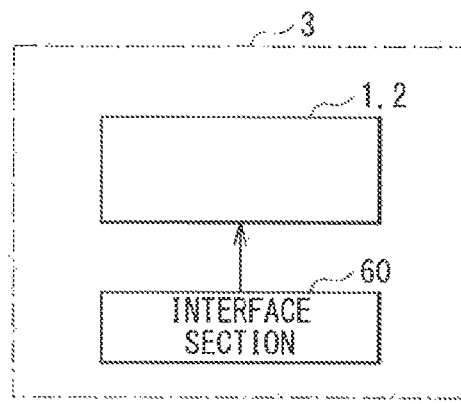
FIG. 19 is a block diagram illustrating a configuration of an electronic apparatus.

The display unit 1 (or imaging unit 2) described in the foregoing example embodiment, etc. may be used for various types of electronic apparatuses. FIG. 19 illustrates a functional block configuration of an electronic apparatus 3. Examples of the electronic apparatus 3 may include a television, a personal computer (PC), a smartphone, a tablet PC, a mobile phone, a digital still camera, and a digital video camera.

The electronic apparatus 3 may include, for example, the above-described display unit 1 (or imaging unit 2) and an interface section 60. The interface section 60 may be an input section that receives various signals and a power supply, for example, from the outside. The interface section 60 may include a user interface such as a touch panel, a keyboard, and operation buttons, for example.

Although description has been given hereinabove with reference to the example embodiment, etc., the technology is not limited thereto, but may be modified in a wide variety of ways. For example, factors such as a material and a thickness of each layer, and a film-forming method as well as a film-forming condition exemplified in the foregoing example embodiment, etc. are illustrative and non-limiting. Any other material, any other thickness, any other film-forming method, any other film-forming condition, and any other factor may be adopted besides those described above.

Although description has been given in the foregoing example embodiment, etc., of the case where the second insulating film 36 containing metal is provided, the second insulating film 36 containing no metal may also be adopted; alternatively, the second insulating film 36 may be omitted.

Moreover, although description has been given in the foregoing example embodiment, etc., of the case where the organic EL element 13 is provided as the display element, any other display element such as the liquid crystal display element may also be provided instead of the organic EL element 13.

The effects described in the foregoing example embodiment, etc. are mere examples. The effects according to an embodiment of the disclosure may be other effects, or may further include other effects in addition to the effects described hereinabove.

It is to be noted that the technology may also have the following configurations.

(1)

A semiconductor device including:

a substrate;

a gate electrode provided on the substrate;

an oxide semiconductor film provided on the substrate with the gate electrode being interposed therebetween, the oxide semiconductor film including a channel region that faces the gate electrode and a low-resistance region adjacent to the channel region;

a first electrode that contains a constituent material same as a constituent material of the gate electrode, the first electrode having a same thickness as a thickness of the gate electrode;

a second electrode having at least a portion that faces the first electrode, the second electrode containing a constituent material same as a constituent material of the oxide semiconductor film; and a third electrode having at least a portion that is provided at a position facing the first electrode with the second electrode being interposed therebetween, the third electrode being electrically coupled to the first electrode.

(2)

The semiconductor device according to (1), further including a channel protective film that covers the channel region of the oxide semiconductor film.

(3)

The semiconductor device according to (2), in which, in a plan view, the channel protective film is provided in inner side of the gate electrode, and is provided to have a width larger than a channel width of the oxide semiconductor film.

(4)

The semiconductor device according to any one of (1) to (3), further including a source-drain electrode electrically coupled to the low-resistance region of the oxide semiconductor film.

(5)

The semiconductor device according to (4), further including:

a first insulating film provided between the oxide semiconductor film and the gate electrode; and a second insulating film that contains metal, and is in contact with the low-resistance region of the oxide semiconductor film.

(6)

The semiconductor device according to (5), further including a third insulating film that covers the second insulating film, in which the source-drain electrode is electrically coupled to the low-resistance region of the oxide semiconductor film through a contact hole provided on the third insulating film and the second insulating film.

(7)

The semiconductor device according to (6), in which the second insulating film and the third insulating film are provided between the second electrode and the third electrode.

(8)

The semiconductor device according to any one of (5) to (7), in which the metal includes aluminum.

(9)

The semiconductor device according to any one of (4) to (8), in which the third electrode contains a constituent material same as a constituent material of the source-drain electrode, and has a same thickness as a thickness of the source-drain electrode.

(10)

The semiconductor device according to any one of (1) to (9), in which the second electrode has a same thickness as a thickness of the low-resistance region of the oxide semiconductor film.

(11)

The semiconductor device according to any one of (1) to (10), in which the first electrode, the second electrode, and the third electrode are provided in this order from the substrate.

(12)

A display unit including:
a semiconductor device; and
a display element layer that is provided on the semiconductor device, and includes a plurality of pixels,
the semiconductor device including
a substrate,
a gate electrode provided on the substrate,
an oxide semiconductor film provided on the substrate with the gate electrode being interposed therebetween, the oxide semiconductor film including a channel region that faces the gate electrode and a low-resistance region adjacent to the channel region,
a first electrode that contains a constituent material same as a constituent material of the gate electrode, the first electrode having a same thickness as a thickness of the gate electrode,
a second electrode having at least a portion that faces the first electrode, the second electrode containing a constituent material same as a constituent material of the oxide semiconductor film, and
a third electrode having at least a portion that is provided at a position facing the first electrode with the second electrode being interposed therebetween, the third electrode being electrically coupled to the first electrode.

(13)

The display unit according to (12), in which
the semiconductor device includes a pixel circuit of each of the plurality of pixels, the pixel circuit including a driving transistor and a switching transistor, and
the gate electrode and the oxide semiconductor film configure the driving transistor in the pixel circuit.

(14)

The display unit according to (13), in which the second electrode is provided integrally with the oxide semiconductor film.

(15)

The display unit according to (12), in which
the semiconductor device includes a pixel circuit of each of the plurality of pixels, the pixel circuit including a driving transistor and a switching transistor, and
the gate electrode and the oxide semiconductor film configure the switching transistor in the pixel circuit.

(16)

The display unit according to (15), in which the second electrode is provided integrally with the oxide semiconductor film.

The semiconductor device and the display unit according to the respective embodiments of the technology include the bottom-gate transistor. The oxide semiconductor film of the transistor is provided with the low-resistance region. Thus, it becomes possible to form the so-called self-aligned structure in which the low-resistance region and the gate electrode have a smaller overlapping region in a plan view. Further, the first electrode, the second electrode, and the third electrode that overlap one another in a plan view form a holding capacitor that has a stacked structure.

According to the semiconductor device and the display unit according to the respective embodiments of the technology, it becomes possible to form the self-aligned structure, thus enabling the parasitic capacitance to be smaller. Further, the holding capacitor of the stacked structure enables larger capacitance to be held per smaller area. It is to be noted that the effects described herein are not necessarily limitative, and may be any effects described in the disclosure.

Although the technology has been described in terms of exemplary embodiments, it is not limited thereto. It should be appreciated that variations may be made in the described embodiments by persons skilled in the art without departing from the scope of the technology as defined by the following claims. The limitations in the claims are to be interpreted broadly based on the language employed in the claims and not limited to examples described in this specification or during the prosecution of the application, and the examples are to be construed as non-exclusive. For example, in this disclosure, the term "preferably" or the like is non-exclusive and means "preferably", but not limited to. The use of the terms first, second, etc. do not denote any order or importance, but rather the terms first, second, etc. are used to distinguish one element from another. The term "substantially" and its variations are defined as being largely but not necessarily wholly what is specified as understood by one of ordinary skill in the art. The term "about" as used herein can allow for a degree of variability in a value or range. Moreover, no element or component in this disclosure is intended to be dedicated to the public regardless of whether the element or component is explicitly recited in the following claims.

What is claimed is:

1. A semiconductor device comprising:
a substrate;
a gate electrode provided on the substrate;
an oxide semiconductor film provided on the substrate with the gate electrode being interposed therebetween, the oxide semiconductor film including a channel region that faces the gate electrode and a low-resistance region adjacent to the channel region;
a first electrode that contains a constituent material same as a constituent material of the gate electrode, the first electrode having a same thickness as a thickness of the gate electrode;
a second electrode having at least a portion that faces the first electrode, the second electrode containing a constituent material same as a constituent material of the oxide semiconductor film; and a third electrode having at least a portion that is provided at a position facing the first electrode with the second electrode being interposed therebetween, the third electrode being electrically coupled to the first electrode and to the low-resistance region.

2. The semiconductor device according to claim 1, further comprising a channel protective film that covers the channel region of the oxide semiconductor film.

3. The semiconductor device according to claim 2, wherein, in a plan view, the channel protective film is provided in inner side of the gate electrode, and is provided to have a width larger than a channel width of the oxide semiconductor film.

4. The semiconductor device according to claim 1, further comprising a source-drain electrode electrically coupled to the low-resistance region of the oxide semiconductor film.

5. The semiconductor device according to claim 4, further comprising:
a first insulating film provided between the oxide semiconductor film and the gate electrode; and
a second insulating film that contains metal, and is in contact with the low-resistance region of the oxide semiconductor film.

6. The semiconductor device according to claim 5, further comprising a third insulating film that covers the second insulating film, wherein
the source-drain electrode is electrically coupled to the low-resistance region of the oxide semiconductor film through a contact hole provided on the third insulating film and the second insulating film.

7. The semiconductor device according to claim 6, wherein the second insulating film and the third insulating film are provided between the second electrode and the third electrode.

8. The semiconductor device according to claim 5, wherein the metal comprises aluminum.

9. The semiconductor device according to claim 4, wherein the source/drain electrode is electrically coupled to the first electrode.

10. The semiconductor device according to claim 4, wherein the source/drain electrode is integral with the first electrode and the third electrode.

11. The semiconductor device of claim 4, wherein the source/drain electrode extends along a sidewall of the low-resistance region.

12. The semiconductor device according to claim 1, wherein the second electrode has a same thickness as a thickness of the low-resistance region of the oxide semiconductor film.

13. The semiconductor device according to claim 1, wherein the first electrode, the second electrode, and the third electrode are provided in this order from the substrate.

14. A display unit comprising:
a semiconductor device; and
a display element layer that is provided on the semiconductor device, and includes a plurality of pixels,
the semiconductor device including
a substrate,
a gate electrode provided on the substrate,
an oxide semiconductor film provided on the substrate with the gate electrode being interposed therebetween, the oxide semiconductor film including a channel region that faces the gate electrode and a low-resistance region adjacent to the channel region,
a first electrode that contains a constituent material same as a constituent material of the gate electrode, the first electrode having a same thickness as a thickness of the gate electrode,
a second electrode having at least a portion that faces the first electrode, the second electrode containing a constituent material same as a constituent material of the oxide semiconductor film,
a third electrode having at least a portion that is provided at a position facing the first electrode with the second electrode being interposed therebetween, the third electrode being electrically coupled to the first electrode; and
a source/drain electrode electrically coupled to the low-resistance region and to the first electrode.

15. The display unit according to claim 14, wherein the semiconductor device includes a pixel circuit of each of the plurality of pixels, the pixel circuit including a driving transistor and a switching transistor, and the gate electrode and the oxide semiconductor film configure the driving transistor in the pixel circuit.

16. The display unit according to claim 15, wherein the second electrode is provided integrally with the oxide semiconductor film.

17. The display unit according to claim 14, wherein the semiconductor device includes a pixel circuit of each of the plurality of pixels, the pixel circuit including a driving transistor and a switching transistor, and the gate electrode and the oxide semiconductor film configure the switching transistor in the pixel circuit.

18. The display unit according to claim 17, wherein the second electrode is provided integrally with the oxide semiconductor film.

19. The semiconductor device of claim 14, wherein the source/drain electrode is integral with the first electrode and the third electrode.

* * * * *